US012598736B2

(12) United States Patent
Huang et al.

(10) Patent No.: US 12,598,736 B2
(45) Date of Patent: Apr. 7, 2026

(54) SEMICONDUCTOR STRUCTURE AND MANUFACTURING METHOD THEREOF

(71) Applicant: CHANGXIN MEMORY TECHNOLOGIES, INC., Hefei City (CN)

(72) Inventors: Juanjuan Huang, Hefei City (CN); Weiping Bai, Hefei City (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 512 days.

(21) Appl. No.: 18/151,534

(22) Filed: Jan. 9, 2023

(65) Prior Publication Data

US 2023/0371236 A1 Nov. 16, 2023

(30) Foreign Application Priority Data

May 12, 2022 (CN) .......................... 202210514708.3

(51) Int. Cl.
*H10B 12/00* (2023.01)
*H10D 1/00* (2025.01)
*H10D 1/68* (2025.01)

(52) U.S. Cl.
CPC ........... *H10B 12/315* (2023.02); *H10B 12/03* (2023.02); *H10B 12/033* (2023.02); *H10D 1/042* (2025.01); *H10D 1/716* (2025.01)

(58) Field of Classification Search
CPC ...... H10B 12/03; H10B 12/033; H10B 12/31; H10B 12/315; H10B 12/318
See application file for complete search history.

(56) References Cited

U.S. PATENT DOCUMENTS

| | | | | | |
|---|---|---|---|---|---|
| 2006/0240679 | A1* | 10/2006 | Lee | ...................... | H10B 12/033 |
| | | | | | 438/785 |
| 2015/0221718 | A1 | 8/2015 | Rhie | | |
| 2021/0366911 | A1 | 11/2021 | Yen | | |
| 2021/0391414 | A1* | 12/2021 | Xia | ......................... | H10D 1/714 |
| 2023/0328959 | A1* | 10/2023 | Huang | ................. | H10B 12/315 |
| | | | | | 257/296 |

FOREIGN PATENT DOCUMENTS

CN        113809080 A  * 12/2021   ............. H10D 1/692

OTHER PUBLICATIONS

Kittl, J.A., et al., "High-k dielectrics for future generation memory devices (Invited Paper)", Microelectronic Engineering, Mar. 13, 2009, pp. 1789-1795, vol. 86.

* cited by examiner

*Primary Examiner* — Brent A. Fairbanks
*Assistant Examiner* — Molly K Reida
(74) *Attorney, Agent, or Firm* — Kilpatrick Townsend & Stockton LLP

(57) ABSTRACT

The present disclosure relates to a semiconductor structure and a manufacturing method thereof. The semiconductor structure includes: a base and a capacitor structure. The base is provided with a capacitive contact structure. The capacitor structure is connected to the capacitive contact structure, and the capacitor structure includes a plurality of capacitor units stacked in a direction vertical to the capacitive contact structure.

20 Claims, 13 Drawing Sheets

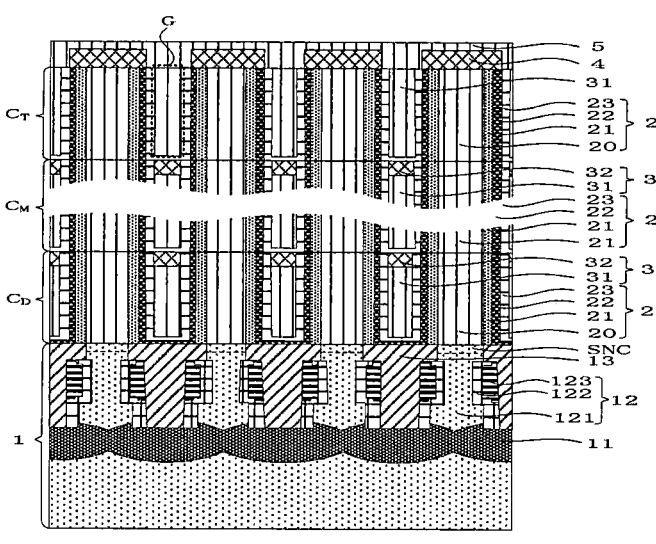

FIG. 22

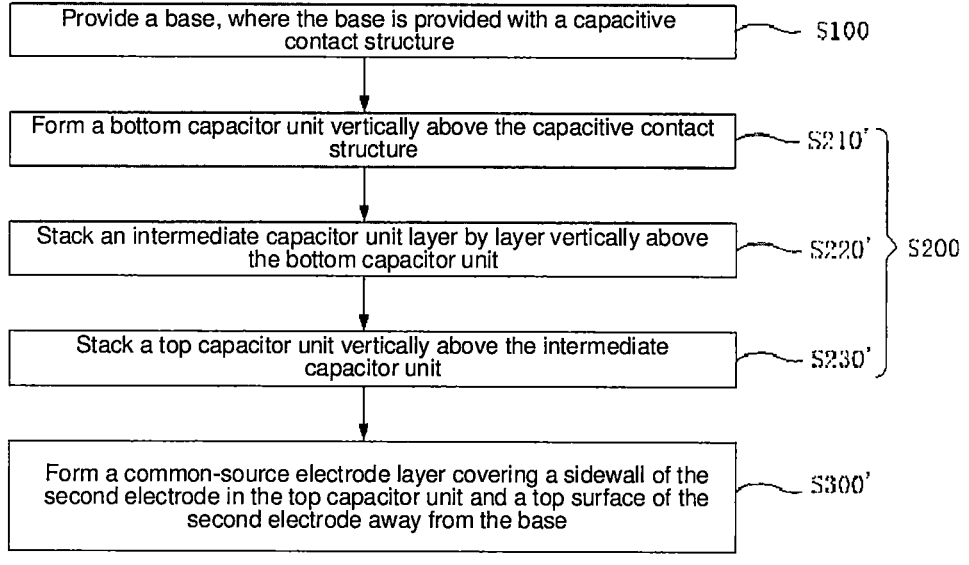

| Provide a base, where the base is provided with a capacitive contact structure | S100 |

| Form a bottom capacitor unit vertically above the capacitive contact structure | S210' |

| Stack an intermediate capacitor unit layer by layer vertically above the bottom capacitor unit | S220' |

| Stack a top capacitor unit vertically above the intermediate capacitor unit | S230' |

S200

| Form a common-source electrode layer covering a sidewall of the second electrode in the top capacitor unit and a top surface of the second electrode away from the base | S300' |

FIG. 23

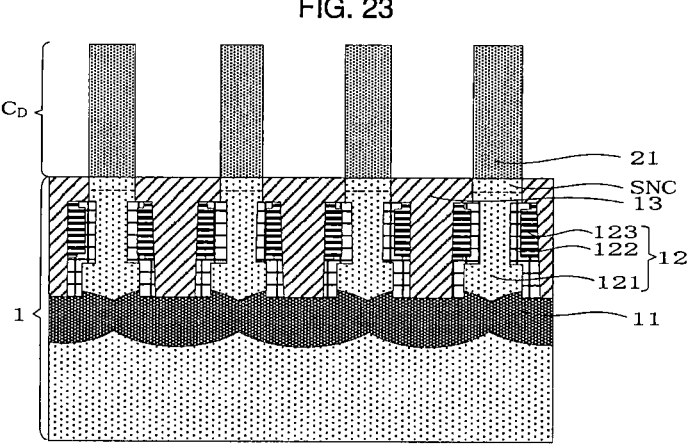

FIG. 24

SEMICONDUCTOR STRUCTURE AND MANUFACTURING METHOD THEREOF

CROSS-REFERENCE TO RELATED APPLICATION

This application claims the priority of Chinese Patent Application No. 202210514708.3, submitted to the Chinese Intellectual Property Office on May 12, 2022, the disclosure of which is incorporated herein in its entirety by reference.

TECHNICAL FIELD

The present disclosure relates to the field of semiconductor integrated circuit manufacturing technologies, in particular to a semiconductor structure and a manufacturing method thereof.

BACKGROUND

As a semiconductor memory commonly used in an electronic device such as a computer, a dynamic random access memory (DRAM) includes a plurality of memory cells. The memory cell includes a memory capacitor, and a transistor electrically connected to the memory capacitor. The transistor includes a gate, a source region, and a drain region. The gate of the transistor is electrically connected to a word line. The source region of the transistor is used to form a bit line contact region to be electrically connected to a bit line by using a bit line contact structure. The drain region of the transistor is used to form a memory node contact region to be electrically connected to the memory capacitor by using a memory node contact structure.

With the continuous development of semiconductor technologies, critical dimensions of devices in an integrated circuit continue to shrink. After the semiconductor process has entered the phase of deep submicron, the size of the DRAM becomes smaller.

Accordingly, transistors have gradually evolved from a buried gate structure to a gate-all-around (GAA) structure that occupies a smaller area. The structure of the memory capacitor has also been adjusted from hexagonal closest packing to quadrilateral packing. Moreover, the radial dimension of the memory capacitor is still shrinking. For example, the memory capacitor is further adjusted from a cup-shaped structure to a columnar structure.

However, the radial dimension of the memory capacitor is decreasing continuously, while a higher depth-to-width ratio tends to increase the etching difficulty and limit the height of the memory capacitor. This also reduces the surface area of the memory capacitor significantly, resulting in a smaller capacity of the memory capacitor, which fails to meet the usage requirements.

SUMMARY

Accordingly, embodiments of the present disclosure provide a semiconductor structure and a manufacturing method thereof.

To achieve the foregoing objective, according to an aspect, some embodiments of the present disclosure provide a semiconductor structure. The semiconductor structure includes: a base and a capacitor structure. The base is provided with a capacitive contact structure. The capacitor structure is connected to the capacitive contact structure.

The capacitor structure includes a plurality of capacitor units stacked in a direction vertical to the capacitive contact structure.

According to another aspect, some embodiments of the present disclosure provide a method of manufacturing a semiconductor structure, including the following steps:

providing a base, where the base is provided with a capacitive contact structure; and stacking a plurality of capacitor units in a direction vertical to the capacitive contact structure to form a capacitor structure. The capacitor structure is connected to the capacitive contact structure.

BRIEF DESCRIPTION OF THE DRAWINGS

To describe the technical solutions in the embodiments of the present disclosure or in the prior art more clearly, the following briefly describes the drawings required for describing the embodiments or the prior art. Apparently, the drawings in the following description merely show some embodiments of the present disclosure, and a person of ordinary skill in the art may still derive other drawings from these drawings without creative efforts.

FIG. 5 to FIG. 22 are sectional views of structures obtained in steps of a method of manufacturing the semiconductor structure shown in FIG. 1;

FIG. 23 is a schematic flowchart of a method of manufacturing the semiconductor structure shown in FIG. 2; and FIG. 24 to FIG. 34 are sectional views of structures obtained in steps of a method of manufacturing the semiconductor structure shown in FIG. 2.

DETAILED DESCRIPTION

Figure 1:
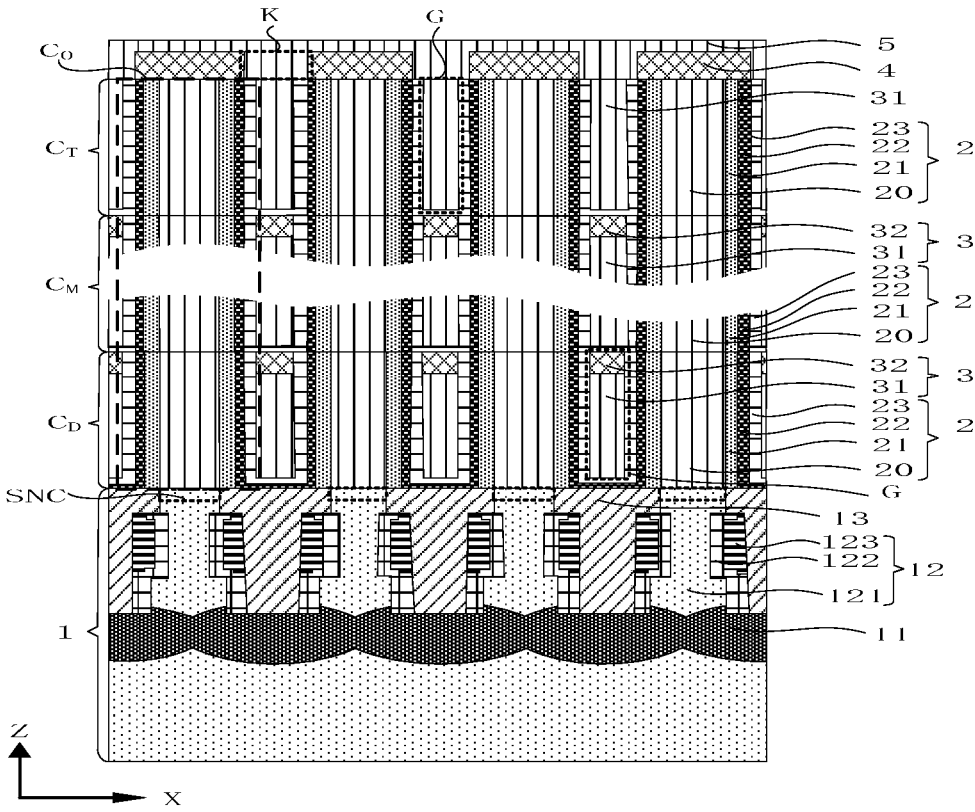
FIG. 1 is a sectional view of a semiconductor structure according to an embodiment.

To facilitate the understanding of the present disclosure, the present disclosure is described more completely below with reference to the related accompanying drawings. The preferred embodiments of the present disclosure are shown in the accompanying drawings. However, the present disclosure may be embodied in various forms without being limited to the embodiments described herein. On the contrary, these embodiments are provided to make the present disclosure more thorough and comprehensive.

Unless otherwise defined, all technical and scientific terms used in the specification have the same meaning as commonly understood by those skilled in the technical field of the present disclosure. The terms used in the specification of the present disclosure are merely for the purpose of describing specific embodiments, rather than to limit the present disclosure.

It should be understood that when an element or a layer is described as "being on", "being adjacent to", "being connected to" or "being coupled to" another element or layer, it can be on, adjacent to, connected to, or coupled to the another element or layer directly, or intervening elements or layers may be present. On the contrary, when an element is described as "being directly on", "being directly adjacent to", "being directly connected to" or "being directly coupled to" another element or layer, there are no intervening elements or layers.

Spatial relationship terms such as "under", "beneath", "lower", "below", "above", and "upper" can be used herein to describe the relationship shown in the figure between one element or feature and another element or feature. It should be understood that in addition to the orientations shown in the figure, the spatial relationship terms further include different orientations of used and operated devices. For example, if a device in the accompanying drawings is turned over, an element or feature described as being "beneath another element", "below it", or "under it" is oriented as being "on" the another element or feature. Therefore, the exemplary terms "beneath" and "under" may include two orientations of above and below. In addition, the device may further include other orientations (for example, a rotation by 90 degrees or other orientations), and the spatial description used herein is interpreted accordingly.

In the specification, the singular forms of "a", "an" and "the/this" may also include plural forms, unless clearly indicated otherwise. It should also be understood that the terms such as "including/comprising" and "having" indicate the existence of the stated features, wholes, steps, operations, components, parts or combinations thereof. However, these terms do not exclude the possibility of the existence of one or more other features, wholes, steps, operations, components, parts or combinations thereof. In this case, in this specification, the term "and/or" includes any and all combinations of related listed items.

Embodiments of the present disclosure are described herein with reference to cross-sectional views as schematic diagrams of idealized embodiments (and intermediate structures) of the present disclosure, such that variations shown in the shapes and due to, for example, manufacturing techniques and/or tolerances can be contemplated. Therefore, the embodiments of the present disclosure should not be limited to the specific shapes of the regions shown herein, but include shape deviations due to, for example, manufacturing techniques. The regions shown in the figure are schematic in nature, and their shapes are not intended to show actual shapes of the regions of the device or limit the scope of the present disclosure.

With the continuous development of semiconductor technologies, critical dimensions of devices in an integrated circuit continue to shrink. After the semiconductor process has entered the phase of deep submicron, the size of the DRAM becomes smaller. Accordingly, transistors have gradually evolved from a buried gate structure to a gate-all-around (GAA) structure that occupies a smaller area. The structure of the memory capacitor has also been adjusted from hexagonal closest packing to quadrilateral packing. Moreover, the radial dimension of the memory capacitor is still shrinking. For example, the memory capacitor is further adjusted from a cup-shaped structure to a columnar structure.

However, the radial dimension of the memory capacitor is decreasing continuously, while a higher depth-to-width ratio tends to increase the etching difficulty and limit the height of the memory capacitor. This also reduces the surface area of the memory capacitor significantly, resulting in a smaller capacity of the memory capacitor, which fails to meet the usage requirements.

In some embodiments, the insufficient capacity can be compensated by increasing the K value of the dielectric layer in the memory capacitor. However, a dielectric material with a higher K value tends to have a narrower band gap is prone to more severe leakage, making it difficult to find a suitable capacitor dielectric material.

Accordingly, some embodiments of the present disclosure provide a semiconductor structure. By means of epitaxial growth and self-alignment, capacitor units are stacked in a direction vertical to a capacitive contact structure, to obtain a relatively high capacitor structure. It is ensured that the formed capacitor structure is structurally stable and has a high capacity, thereby effectively improving the electrical performance and production yield of the semiconductor structure.

Figure 2:
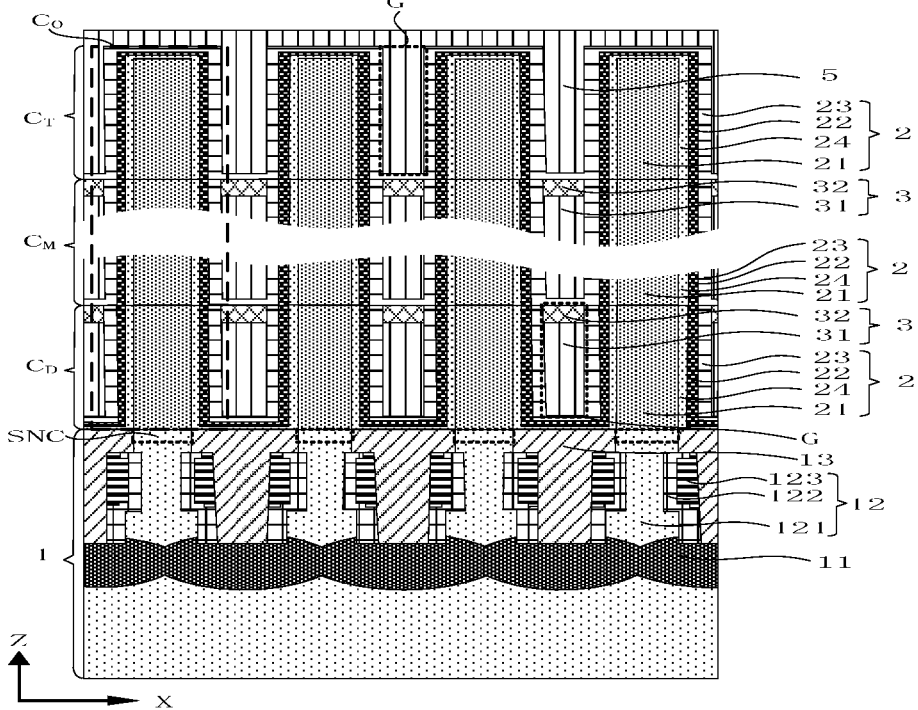
FIG. 2 is a schematic structural diagram of another semiconductor structure according to an embodiment.

Referring to FIG. 1 and FIG. 2, some embodiments of the present disclosure provide a semiconductor structure. The semiconductor structure includes: a base 1 and a capacitor structure $C_0$. The base 1 is provided with capacitive contact structures SNC. The capacitor structure $C_0$ is connected to the capacitive contact structure SNC. The capacitor structure $C_0$ includes a plurality of capacitor units 2 stacked in a direction vertical to the capacitive contact structure SNC.

In some embodiments, the base 1 may be made of a semiconductor material, an insulating material, a conductor material, or any combination thereof. The base 1 may be of a single-layer structure or a multi-layer structure. For example, the base 1 may be a silicon (Si) base, a silicon germanium (SiGe) base, a silicon germanium carbon (SiGeC) base, a silicon carbide (SiC) base, a gallium arsenide (GaAs) base, an indium arsenide (InAs) base, an indium phosphide (InP) base, or another III/V semiconductor base or II/VI semiconductor base. Alternatively, in another example, the base 1 may be a layered base including, for example, Si/SiGe, Si/SiC, silicon-on-insulator (SOI), or silicon-germanium-on-insulator.

Optionally, the base 1 is a silicon base or a silicon-based base. As shown in FIG. 1 or FIG. 2, a buried bit line 11 and gate-all-around transistors (GAA transistors) 12 connected to the buried bit line 11 may be provided in the base 1. A plurality of buried bit lines 11 may be arranged in parallel at intervals in the base 1, and the buried bit line 11 extends along a first direction. One buried bit line 11 may be correspondingly connected to a plurality of gate-all-around transistors 12 arranged along the first direction. The gate-all-around transistor 12 is located above the buried bit line 11. The gate-all-around transistor 12 includes: a channel pillar 121, a gate insulating layer 122, and a gate word line 123. The channel pillar 121 includes: a conductive channel arranged along a direction perpendicular to the base 1 as well as a source and a drain located at two ends of the conductive channel respectively. The channel pillar 121 may be formed by etching the base 1; the source and drain may be formed by doping corresponding regions of the channel pillar 121 with ions. The drain is connected to the buried bit line 11. The source is located at an end of the conductive channel away from the bit line. The source can be directly used as a capacitive contact structure SNC, or the source may be connected to the capacitor unit 2 through a capacitive contact structure SNC (that is, a conductive structure may be formed on a surface of the source such that the conductive structure serves as a capacitive contact structure). The gate insulating layer 122 surrounds a sidewall of the channel pillar 121. The gate word line 123 is located on a surface of the gate insulating layer 122 away from the surface of the conductive channel, and extends along a second direction. The second direction intersects with, for example, is orthogonal to, the first direction.

The gate-all-around transistor is a vertical gate-all-around transistor, which can have a high degree of integration in a vertical direction, thereby effectively reducing a planar area occupied by the transistor, so as to increase an integration density of the transistors. Moreover, it is easier to vertically stack multiple layers of capacitor units above, to effectively improve the memory integration density of the semiconductor structure.

In the embodiments of the present disclosure, a capacitor structure $C_0$ is connected to the capacitive contact structure SNC, and the capacitor structure $C_0$ includes a plurality of capacitor units 2 stacked in a direction vertical to the capacitive contact structure SNC. That is, the plurality of capacitor units may be stacked in a self-aligned manner based on the capacitive contact structure SNC. Moreover, a stacking manner of the plurality of capacitor units 2 may be selected as needed.

In some embodiments, referring to FIG. 1, depending on different stacking positions of the capacitor units 2, the capacitor unit 2 may be classified as a bottom capacitor unit $C_D$, an intermediate capacitor unit $C_M$, or a top capacitor unit $C_T$ accordingly. It is understandable that, despite the different stacking positions of the capacitor units 2, the capacitor unit 2 at any position includes: a capacitive connection structure 20, a first electrode 21, a high-K dielectric layer 22, and a second electrode 23. The first electrode 21 and the second electrode 23 may be made of a metal or metal compound with good conductivity, for example, made of titanium nitride (TiN) through atomic layer deposition. The high-K dielectric layer 22 may be selected according to an actual requirement, and may be, for example, a silicon nitride layer. This is not limited in the embodiments of the present disclosure.

For example, the capacitive connection structure 20 is located vertically above the capacitive contact structure SNC, and in any adjacent two of the capacitor units 2 in a direction perpendicular to the capacitive contact structure SNC (e.g., direction Z), the capacitive connection structures 20 are interconnected and connected to the capacitive contact structure SNC. That is, the capacitive connection structure 20 in the bottom capacitor unit $C_D$ may be directly connected to the capacitive contact structure SNC, while the capacitive connection structures 20 in the capacitor units 2 stacked in other layers may be sequentially connected in series through the capacitive connection structure 20 below, so as to be connected to the capacitive contact structure SNC.

Optionally, the capacitive connection structure 20 may be formed through an epitaxial growth process. The capacitive connection structure 20 may be a conductive structure made of silicon germanium (SiGe) or other conductive materials capable of unidirectional growth along a (100) crystalline surface. The capacitive connection structure 20 is located vertically above the capacitive contact structure SNC, and may be formed in a self-aligned manner based on the capacitive contact structure SNC. That is, orthographic projection of the capacitive connection structure 20 on the base 1 may coincide with orthographic projection of the capacitive contact structure SNC on the base 1. The capacitive connection structure 20 is, for example, a conductive pillar, and the orthographic projection of the capacitive connection structure 20 on the base 1 may be circular, elliptical, or polygonal, which is not limited in the embodiments of the present disclosure.

For example, the first electrode 21 may be located on a sidewall of the capacitive connection structure 20, and in any adjacent two of the capacitor units 2 in the direction vertical to the capacitive contact structure SNC (e.g., direction Z), the first electrodes 21 are interconnected. The high-K dielectric layer 22 is arranged on a sidewall of the first electrode 21, and in any adjacent two of the capacitor units 2 in the direction vertical to the capacitive contact structure SNC (e.g., direction Z), the high-K dielectric layers 22 are interconnected. The second electrode 23 is arranged on a sidewall of the high-K dielectric layer 22, and in any adjacent two of the capacitor units 2 in the direction vertical to the capacitive contact structure SNC, the second electrodes 23 are interconnected.

In some embodiments, further referring to FIG. 1, the semiconductor structure further includes: a top dielectric layer 4 covering the capacitor structure $C_0$ and a common-source electrode layer 5 located above the top dielectric layer 4. The top dielectric layer 4 has an opening K. The common-source electrode layer 5 is connected to the second electrode 23 through the opening K.

Herein, the top dielectric layer 4 is made of an insulating material, for example, at least one of a silicon oxide layer, a silicon nitride layer, or a silicon oxynitride layer. The top dielectric layer 4 has the opening K, and the second electrode 23 in the top capacitor unit $C_T$ may be exposed from the opening K. The common-source electrode layer 5 covers the top dielectric layer 4, and is connected to the second electrode 23 through the opening K, such that the second electrodes 23 in a plurality of capacitor units 2 in a direction parallel to the base 1 (e.g., direction X) are interconnected and an electrical signal is provided to each second electrode 23. The common-source electrode layer 5 may be made of a metal or metal compound with good conductivity, for example, silicon germanium (SiGe).

It should be noted that, further referring to FIG. 1, in some embodiments, a plurality of capacitive contact structures SNC are distributed on the base 1 in an array. In any adjacent two of the capacitor units 2 in the direction parallel to the base 1 (e.g., direction X), the second electrodes 23 are interconnected. That is, in a plurality of capacitor units 2 located in the same layer in the direction parallel to the base 1 (e.g., direction X), the second electrodes 23 may be interconnected to form one electrode.

Further referring to FIG. 1, in some embodiments, in any adjacent two of the capacitor units 2 in the direction parallel to the base 1 (e.g., direction X), bottom portions of the second electrodes 23 are interconnected to form a groove G. The semiconductor structure further includes a support structure 3 located in the groove G. The support structure 3 is located in the groove G, and can support the capacitor units 2 formed in the direction vertical to the capacitive contact structure SNC (e.g., direction Z), to enhance the structural stability of the capacitor unit 2, which facilitates stacking of more layers of capacitor units 2 to obtain a capacitor structure $C_0$ with a higher capacity.

Optionally, an upper surface of the support structure 3 away from the base 1 is flush with a top surface of the second electrode 23 away from the base 1. That is, the support structure 3 can fill up the groove G, to ensure that adjacent capacitor units 2 in the same layer can be effectively supported by the support structure 3 and form a flat surface, to facilitate stacking of more capacitor units 2.

It is understandable that, the shape and material of the support structure 3 may be designed based on the stacking position of the capacitor unit 2 and the structure of the groove G.

For example, in the top capacitor unit $C_T$ shown in FIG. 1, the support structure 3 includes: an auxiliary conductive portion 31 connected to the adjacent second electrodes 23. That is, the support structure 3 may consist of the auxiliary conductive portion 31 only. The auxiliary conductive portion 31 may be made of a metal or metal compound with good conductivity, for example, silicon germanium (SiGe). The auxiliary conductive portion 31 is connected to the second electrode 23, and can assist the second electrode 23 in providing an electrical signal, thereby helping improve the capacity of the capacitor unit 2. Moreover, in the top capacitor unit C_T shown in FIG. 1, the support structure 3 consists of the auxiliary conductive portion 31. The auxiliary conductive portion 31 may be exposed from the opening K of the top dielectric layer 4 and connected to the common-source electrode layer 5 together with the second electrode 23.

For example, in the bottom capacitor unit C_D and the intermediate capacitor unit C_M shown in FIG. 1, the support structure 3 includes: an auxiliary conductive portion 31 and a support portion 32 located above the auxiliary conductive portion 31; the auxiliary conductive portion 31 is connected to the adjacent second electrodes 23. The auxiliary conductive portion 31 may be made of a metal or metal compound with good conductivity, for example, silicon germanium (SiGe). The auxiliary conductive portion 31 is connected to the second electrode 23, and can assist the second electrode 23 in providing an electric signal, thereby helping improve the capacity of the capacitor unit 2. The support portion 32, may be made of an insulating material, such as silicon nitride. The support portion 32 may have relatively high hardness. For example, hardness of the support portion 32 is higher than that of silicon germanium. An upper surface of the support portion 32 away from the base 1 is flush with a top surface of the second electrode 23 away from the base 1. This helps enhance the support capability of the support structure 3.

In addition, in the bottom capacitor unit C_D and the intermediate capacitor unit C_M shown in FIG. 1, alternatively, the support structure 3 may be the same as the support structure 3 used in the top capacitor unit C_T.

In other embodiments, referring to FIG. 2, depending on different stacking positions of the capacitor units 2, the capacitor unit 2 may be classified as a bottom capacitor unit C_D, an intermediate capacitor unit C_M, or a top capacitor unit C_T accordingly. It is understandable that, despite the different stacking positions of the capacitor units 2, the capacitor unit 2 at any position includes: a first electrode 21, a high-K dielectric layer 22, and a second electrode 23.

For example, as shown in FIG. 2, the capacitor unit 2 includes: a first electrode 21, a high-K dielectric layer 22, and a second electrode 23. The first electrode 21 is located vertically above the capacitive contact structure SNC, and in any adjacent two of the capacitor units 2 in the direction vertical to the capacitive contact structure SNC (e.g., direction Z), the first electrodes 21 are interconnected and connected to the capacitive contact structure SNC. That is, the first electrode 21 in the bottom capacitor unit C_D may be directly connected to the capacitive contact structure SNC, while the first electrodes 21 in the capacitor units 2 stacked in other layers may be sequentially connected in series through the first electrode 21 below, so as to be connected to the capacitive contact structure SNC.

Optionally, the first electrode 21 may be formed through an epitaxial growth process. The first electrode 21 may be a conductive structure made of silicon germanium (SiGe) or other conductive materials capable of unidirectional growth along a (100) crystalline surface. The first electrode 21 is located vertically above the capacitive contact structure SNC, and may be formed in a self-aligned manner based on the capacitive contact structure SNC. That is, orthographic projection of the first electrode 21 on the base 1 may coincide with orthographic projection of the capacitive contact structure SNC on the base 1. The first electrode 21 is, for example, a conductive pillar, and the orthographic projection of the first electrode 21 on the base 1 may be circular, elliptical, or polygonal, which is not limited in the embodiments of the present disclosure.

For example, the high-K dielectric layer 22 is arranged on a sidewall of the first electrode 21, and in any adjacent two of the capacitor units 2 in the direction vertical to the capacitive contact structure SNC (e.g., direction Z), the high-K dielectric layers 22 are interconnected. The second electrode 23 is arranged on a sidewall of the high-K dielectric layer 22, and in any adjacent two of the capacitor units 2 in the direction vertical to the capacitive contact structure SNC (e.g., direction Z), the second electrodes 23 are interconnected.

In some embodiments, further referring to FIG. 2, a barrier layer 24 is further provided between the first electrode 21 and the high-K dielectric layer 22. The barrier layer 24 is, for example, a titanium nitride layer, a titanium layer, a tantalum layer or a tantalum nitride layer. The barrier layer 24 can block molecular diffusion between the first electrode 21 and the high-K dielectric layer 22, to ensure stable electrical performance of the first electrode 21. For example, the first electrode 21 may be a conductive structure made of silicon germanium (SiGe) or other conductive materials capable of unidirectional growth along a (100) crystalline surface. The high-K dielectric layer 22 is an oxide layer with a relatively high dielectric constant. The barrier layer 24 can effectively prevent the first electrode 21 from oxidization due to diffusion of oxygen ions in the high-K dielectric layer 22.

In addition, the second electrode 23 may be made of a metal or metal compound with good conductivity, for example, made of titanium nitride (TiN) through atomic layer deposition. The high-K dielectric layer 22 may be selected according to an actual requirement, and may be, for example, a silicon nitride layer. This is not limited in the embodiments of the present disclosure.

In some embodiments, further referring to FIG. 2, the high-K dielectric layer 22 in the capacitor unit 2 in a top layer (i.e., the foregoing top capacitor unit C_T) further covers a top surface of the first electrode 21 away from the base 1, and the second electrode 23 in the capacitor unit 2 in the top layer further covers a top surface of the high-K dielectric layer 22 away from the base 1. The semiconductor structure further includes: a common-source electrode layer 5 covering a sidewall of the second electrode 23 and a top surface of the second electrode 23 away from the base 1. The common-source electrode layer 5 covers the second electrodes 23, such that the second electrodes 23 in a plurality of capacitor units 2 in a direction parallel to the base 1 (e.g., direction X) are interconnected and an electrical signal is provided to each second electrode 23. The common-source electrode layer 5 may be made of a metal or metal compound with good conductivity, for example, silicon germanium (SiGe).

It should be noted that, further referring to FIG. 2, in some embodiments, a plurality of capacitive contact structures SNC are distributed on the base 1 in an array. In any adjacent two of the capacitor units 2 in the direction parallel to the base 1 (e.g., direction X), the second electrodes 23 are interconnected. That is, in a plurality of capacitor units 2 located in the same layer in the direction parallel to the base 1 (e.g., direction X), the second electrodes 23 may be interconnected to form one electrode.

Further referring to FIG. 2, in some embodiments, in any adjacent two of the capacitor units 2 in the direction parallel to the base 1 (e.g., direction X), bottom portions of the second electrodes 23 are interconnected to form a groove G. The semiconductor structure further includes a support structure 3 located in the groove G. The support structure 3 is located in the groove G, and can support the capacitor unit 2 formed in the direction vertical to the capacitive contact structure SNC (e.g., direction Z), to enhance the structural stability of the capacitor unit 2, which facilitates stacking of more layers of capacitor units 2 to obtain a capacitor structure $C_0$ with a higher capacity.

Optionally, an upper surface of the support structure 3 away from the base 1 is flush with a top surface of the second electrode 23 away from the base 1. That is, the support structure 3 can fill up the groove G, to ensure that adjacent capacitor units 2 in the same layer can be effectively supported by the support structure 3 and form a flat surface, to facilitate stacking of more capacitor units 2.

It is understandable that, the shape and material of the support structure 3 may be designed based on the stacking position of the capacitor unit 2 and the structure of the groove G.

For example, in the top capacitor units $C_T$ shown in FIG. 2, the common-source electrode layer 5 covers the second electrodes 23, and can fill up the groove G between adjacent second electrodes 23 in the top capacitor units $C_T$. That is, the support structure 3 in the groove G between adjacent second electrodes 23 in the top capacitor units $C_T$ may be omitted, such that a part filled with the common-source electrode layer 5 is used to achieve a supporting function.

For example, in the bottom capacitor unit $C_D$ and the intermediate capacitor unit $C_M$ shown in FIG. 2, the support structure 3 includes: an auxiliary conductive portion 31 and a support portion 32 located above the auxiliary conductive portion 31; the auxiliary conductive portion 31 is connected to the adjacent second electrodes 23. The auxiliary conductive portion 31 may be made of a metal or metal compound with good conductivity, for example, silicon germanium (SiGe). The auxiliary conductive portion 31 is connected to the second electrode 23, and can assist the second electrode 23 in providing an electrical signal, thereby helping improve the capacity of the capacitor unit 2. The support portion 32, may be made of an insulating material, such as silicon nitride. The support portion 32 may have relatively high hardness. For example, hardness of the support portion 32 is higher than that of silicon germanium. An upper surface of the support portion 32 away from the base 1 is flush with a top surface of the second electrode 23 away from the base 1. This helps enhance the support capability of the support structure 3.

In addition, in the bottom capacitor unit $C_D$ and the intermediate capacitor unit $C_M$ shown in FIG. 2, the support structure 3 may adopts another structure. For example, the support structure 3 includes: an auxiliary conductive portion 31 connected to the adjacent second electrodes 23. That is, the support structure 3 may consist of the auxiliary conductive portion 31 only. The auxiliary conductive portion 31 may be made of a metal or metal compound with good conductivity, for example, silicon germanium (SiGe). The auxiliary conductive portion 31 is connected to the second electrode 23, and can assist the second electrode 23 in providing an electrical signal, thereby helping improve the capacity of the capacitor unit 2.

As described above, in the semiconductor structure provided by the embodiments of the present disclosure, a plurality of capacitor units 2 can be stacked in a direction perpendicular to a capacitive contact structure SNC (e.g., direction Z), to form a capacitor structure $C_0$. In this way, while the radial size of the capacitor structure shrinks continuously, the depth-to-width ratio of the capacitor unit 2 in each layer can be reduced, and etching with a high depth-to-width ratio can be avoided, thereby eliminating the problem of increased etching difficulty caused by a higher depth-to-width ratio. Thus, the process difficulty of the capacitor structure $C_0$ is greatly reduced, and the stability of the capacitor structure $C_0$ is effectively improved, to avoid stack collapsing of the capacitor structure $C_0$. Moreover, in the embodiments of the present disclosure, by means of epitaxial growth and self-alignment, the capacitor units 2 are stacked in the direction vertical to the capacitive contact structure SNC, which can further reduce the number of masks in use and effectively reduce stacking deviation, thereby further reducing the process difficulty of the capacitor structure.

In addition, in the embodiments of the present disclosure, by stacking a plurality of capacitor units 2, a relatively high capacitor structure $C_0$ can be obtained, to ensure that the formed capacitor structure $C_0$ has a relatively large capacitance area. In this way, it is ensured that the formed capacitor structure is structurally stable and has a high capacity while the size of the semiconductor structure is reduced repeatedly $C_0$, thereby effectively improving the electrical performance and production yield of the semiconductor structure.

Figure 3:
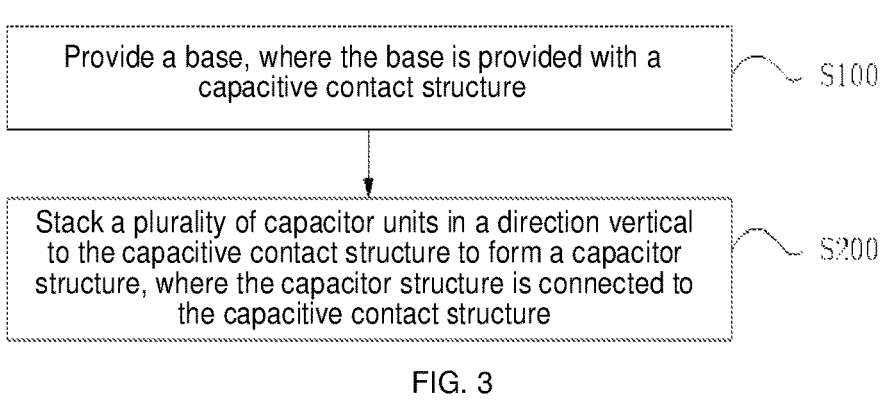
FIG. 3 is a schematic flowchart of a method of manufacturing a semiconductor structure according to an embodiment.

According to another aspect, some embodiments of the present disclosure provide a method of manufacturing a semiconductor structure, for manufacturing the semiconductor structure in the foregoing embodiments. The manufacturing method has all the technical advantages of the semiconductor structure described above. Details are not described herein again. Referring to FIG. 3, the manufacturing method includes the following steps:

S100: Provide a base, where the base is provided with a capacitive contact structure.

S200: Stack a plurality of capacitor units in a direction vertical to the capacitive contact structure to form a capacitor structure. The capacitor structure is connected to the capacitive contact structure.

It can be understood that a method of manufacturing the capacitor unit varies with a structure of the capacitor unit. Manufacturing methods of the two semiconductor structures shown in FIG. 1 and FIG. 2 are described below.

Figure 4:
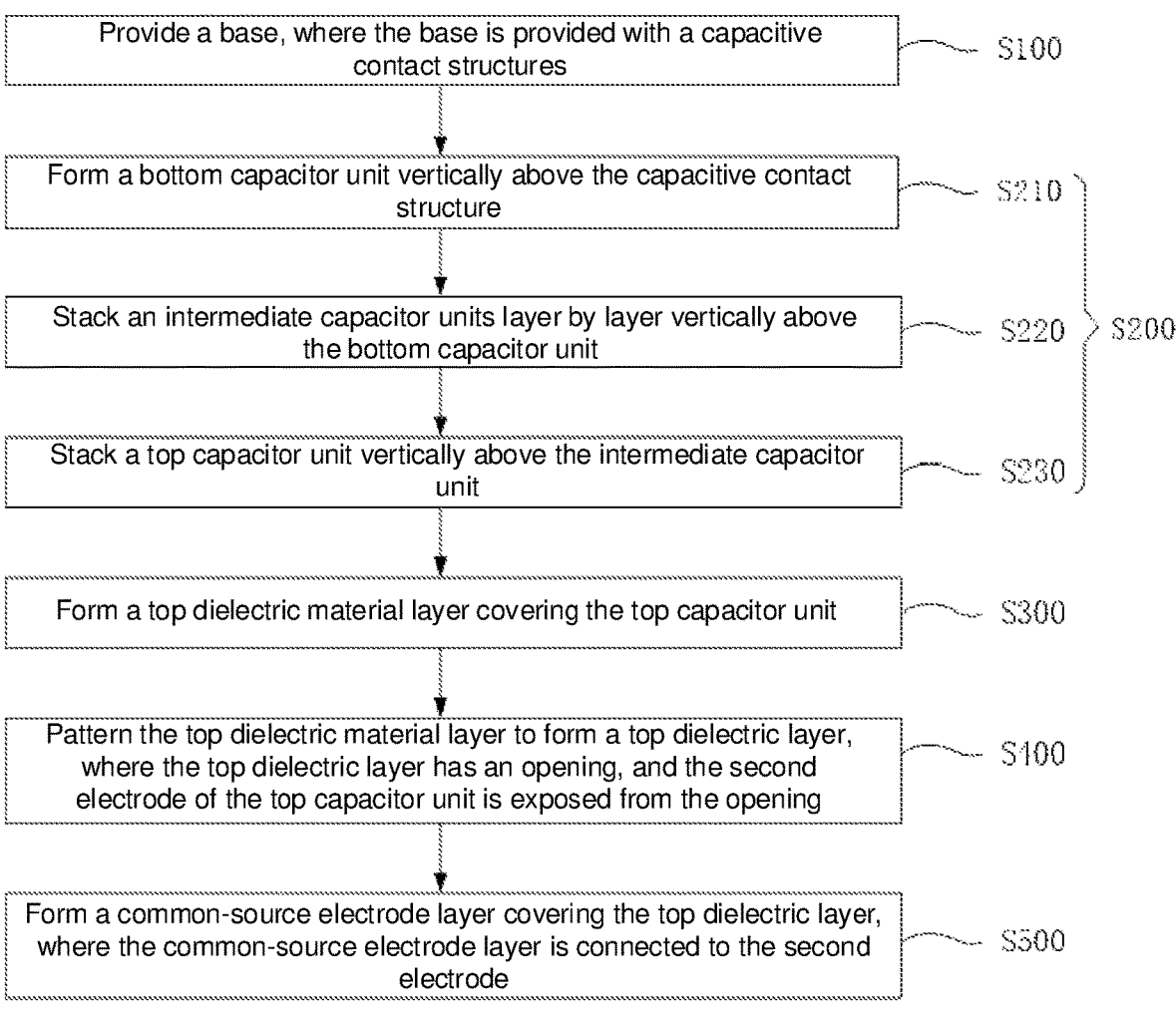
FIG. 4 is a schematic flowchart of a method of manufacturing the semiconductor structure shown in FIG. 1.

Referring to FIG. 4, in some embodiments, the manufacturing method is used for manufacturing the semiconductor structure shown in FIG. 1. Step S200 of stacking a plurality of capacitor units in a direction vertical to the capacitive contact structure to form a capacitor structure includes the following steps:

S210: Form a bottom capacitor unit vertically above the capacitive contact structure.

For example, a capacitive connection structure is formed vertically above the capacitive contact structure, and a first electrode, a high-K dielectric layer, and a second electrode are sequentially formed on a sidewall of the capacitive connection structure.

S220: Stack an intermediate capacitor unit layer by layer vertically above the bottom capacitor unit.

For example, there may be one or more layers of intermediate capacitor units. If the bottom capacitor unit is considered as a first-layer capacitor unit, the intermediate capacitor unit may be in an (N+1)-th layer, where N is a positive integer and 2≤N+1≤M. Accordingly, forming the intermediate capacitor unit in an (N+1)-th layer includes: forming a capacitive connection structure of the (N+1)-th layer vertically above a capacitive connection structure of an N-th layer, and sequentially forming a first electrode, a high-K dielectric layer, and a second electrode on a sidewall of the capacitive connection structure of the (N+1)-th layer. That is, the intermediate capacitor units may be stacked from the second layer to an M-th layer.

In the embodiments of the present disclosure, the capacitive connection structures may epitaxially grown repeatedly; the capacitor units are stacked in a self-aligned manner, and the height of the capacitor structure is increased. The number of stacked layers is not limited, which can be selected as needed.

S230: Stack a top capacitor unit vertically above the intermediate capacitor unit.

For example, a capacitive connection structure of an (M+1)-th layer is formed vertically above a capacitive connection structure of an M-th layer, and a first electrode, a high-K dielectric layer, and a second electrode are sequentially formed on a sidewall of the capacitive connection structure of the (M+1)-th layer.

In some embodiments, further referring to FIG. 4, the manufacturing method further includes the following steps:

S300: Form a top dielectric material layer covering the top capacitor unit.

S400: Pattern the top dielectric material layer to form a top dielectric layer. The top dielectric layer has an opening, and the second electrode of the top capacitor unit is exposed from the opening.

S500: Form a common-source electrode layer covering the top dielectric layer, where the common-source electrode layer is connected to the second electrode.

To illustrate the foregoing manufacturing method more clearly, the following embodiments are described with reference to FIG. 4 and FIG. 5 to FIG. 22.

Figure 5:
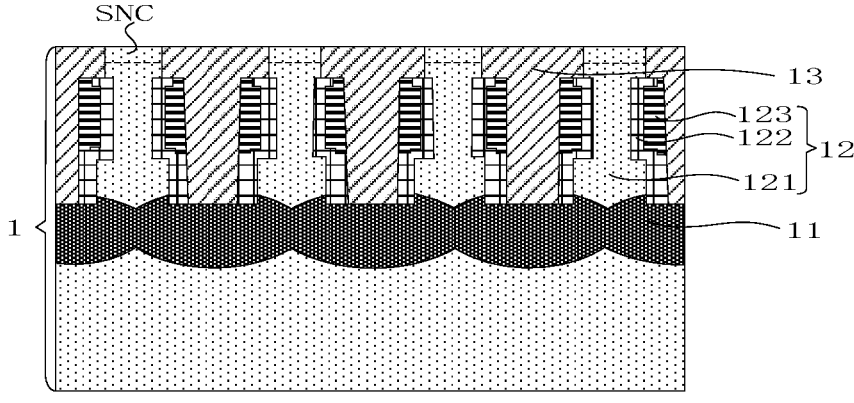

In step S100, referring to FIG. 5, a base 1 is provided, where the base 1 is provided with a capacitive contact structure SNC.

For the arrangement manner of the base 1 and the capacitive contact structures SNC herein, reference may be made to related description in the foregoing embodiments.

It is understandable that, after the capacitive contact structure SNC is formed on the base 1, the surface of the base 1 is generally polished. For example, chemical mechanical polishing is performed, such that the surface of the base 1 has better surface quality, to facilitate subsequent epitaxial growth of a capacitive connection structure 20 or a first electrode 21 on the base 1.

In step S210, referring to FIG. 6 to FIG. 10, a bottom capacitor unit $C_D$ is formed vertically above the capacitive contact structure SNC, which includes steps S210A to S210D.

Figure 6:
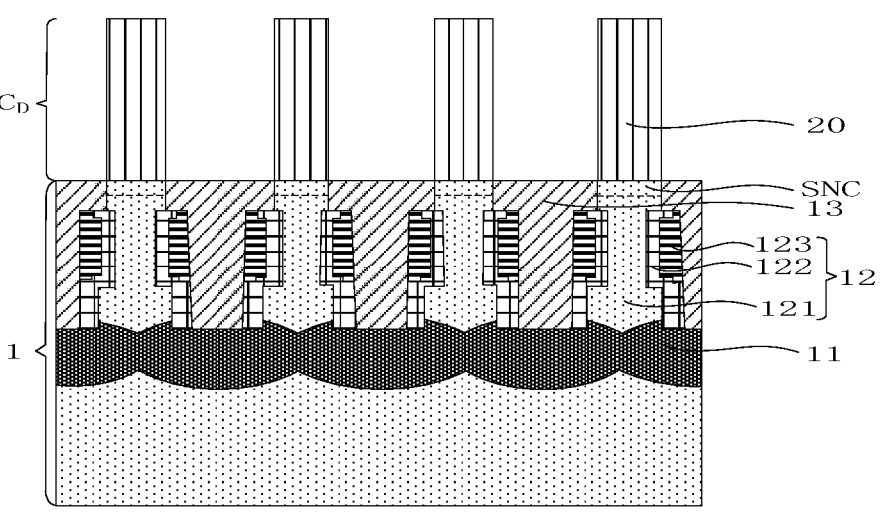

S210A: Form a capacitive connection structure 20 vertically above the capacitive contact structure SNC, as shown in FIG. 6.

For example, the capacitive connection structure 20 is formed through an epitaxial growth process. That is, the capacitive connection structure 20 may be epitaxially grown on the surface of the capacitive contact structure SNC, such that the capacitive connection structure 20 is self-aligned with the capacitive contact structure SNC.

Figure 7:
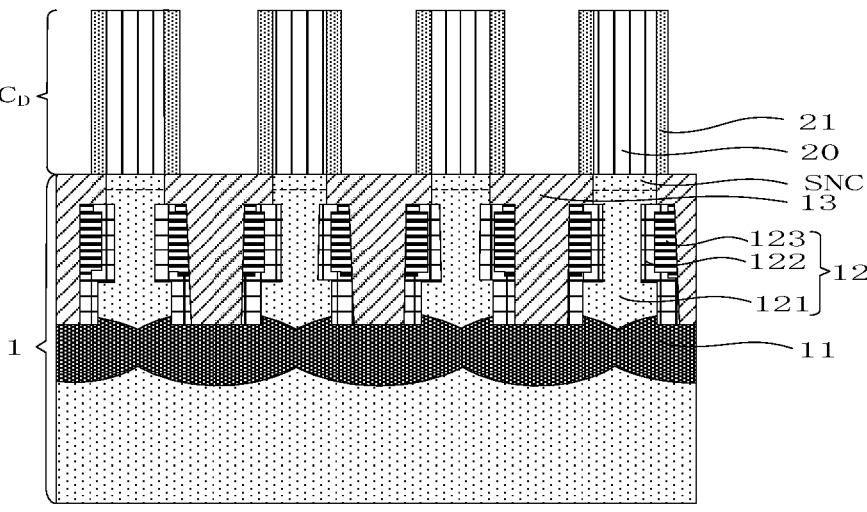

S210B: Form a first electrode 21 on a sidewall of the capacitive connection structure 20, as shown in FIG. 7.

S210C: Sequentially deposit a high-K dielectric material layer 220 and a second electrode material layer 230, as shown in FIG. 8.

Figure 8:
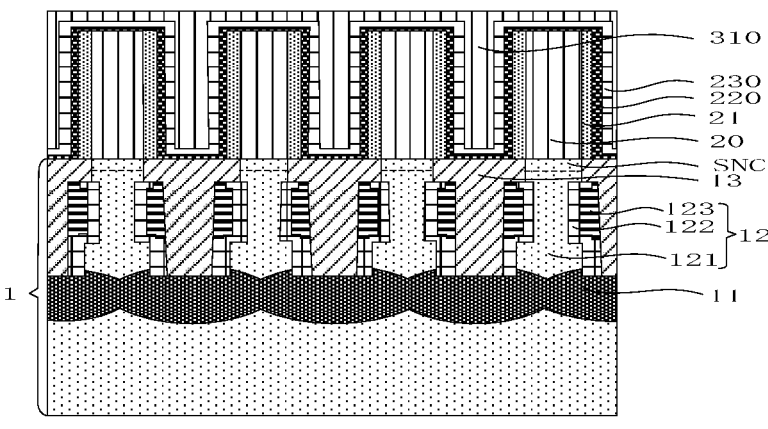

Optionally, in an example in which the semiconductor structure further includes the support structures 3, referring to FIG. 8, S210C further includes: depositing an auxiliary conductive material layer 310 covering the second electrode material layer 230. Accordingly, referring to FIG. 9, the manufacturing method further includes: removing part of the auxiliary conductive material layer 310, to form auxiliary conductive portions 31 each located between any adjacent two of the capacitor units 2 in a direction parallel to the base 1.

Figure 9:
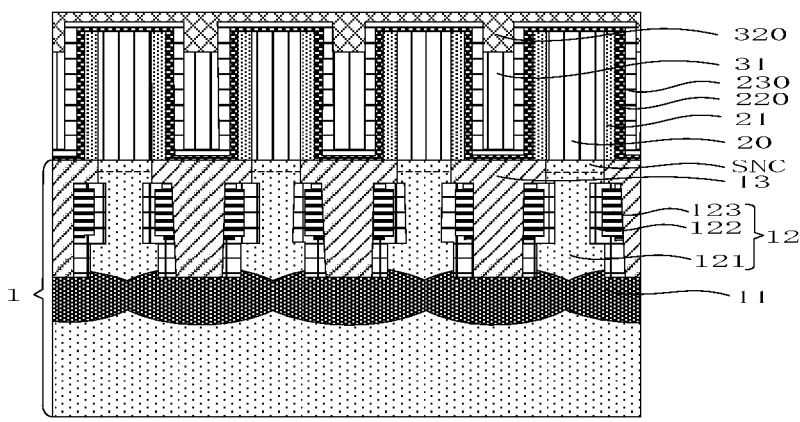

In some examples in which the support structure 3 further includes the support portion 32, referring to FIG. 9, the manufacturing method further includes: depositing a support material layer 320 covering the second electrode material layer 230 and the auxiliary conductive portions 31. Accordingly, referring to FIG. 10, the manufacturing method further includes: removing part of the support material layer 320, to form support portions 32 each located between any adjacent two of the capacitor units 2 in the direction parallel to the base 1. The support portion 32 is located above the auxiliary conductive portion 31, and forms a support structure 3 jointly with the auxiliary conductive portion 31.

Herein, it is understandable that the method of manufacturing the support structure 3 may be adjusted adaptively as the support structure 3 varies.

Figure 10:
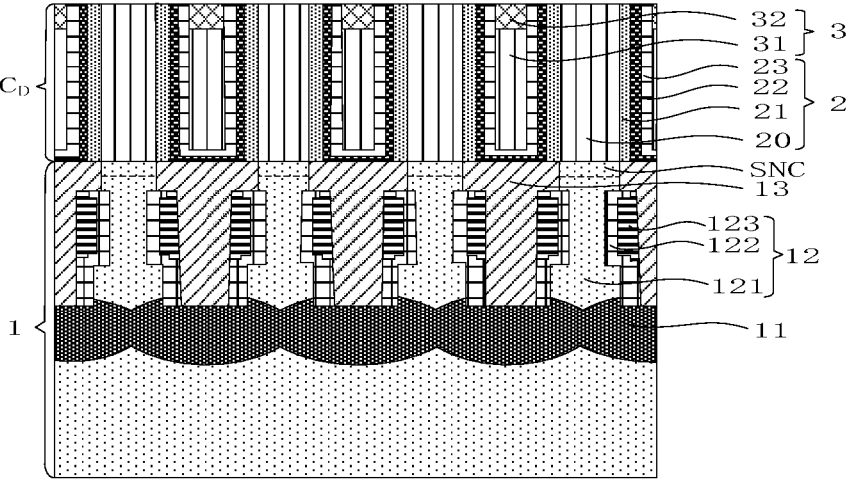

S210D: Remove part of the high-K dielectric material layer 220 and part of the second electrode material layer 230, to form a high-K dielectric layer 22 located on a sidewall of the first electrode 21 and a second electrode 23 located on a sidewall of the high-K dielectric layer 22, as shown in FIG. 10. Thus, preparation of the bottom capacitor unit $C_D$ is completed.

In step S220, referring to FIG. 11 to FIG. 15, one or more intermediate capacitor units $C_M$ are stacked layer by layer vertically above the bottom capacitor unit $C_D$, which includes steps S220A to S220D.

Figure 11:
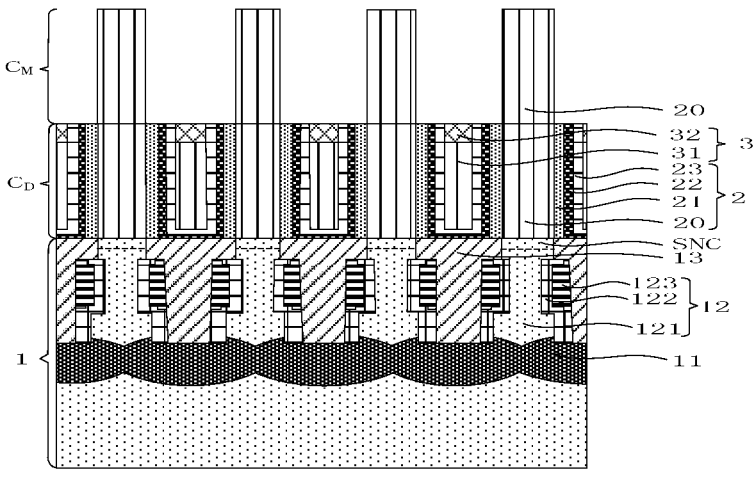

S220A: Form a first-layer capacitive connection structure 20 of the intermediate capacitor unit $C_M$ vertically above the capacitive connection structure 20 in the bottom capacitor unit $C_D$, as shown in FIG. 11.

For example, the capacitive connection structure 20 is formed through an epitaxial growth process. That is, an upper-layer capacitive connection structure 20 may be epitaxially grown on the surface of a lower-layer capacitive connection structure 20, to achieve self-alignment between the capacitive connection structures 20 in the two layers.

It is understandable that, after the capacitive connection structure 20 is formed, in the intermediate capacitor units $C_M$ at any layers, identical structures are manufactured by a same method. Therefore, manufacturing of other structures in the intermediate capacitor unit $C_M$ in one layer is used as an example for description.

Figure 12:
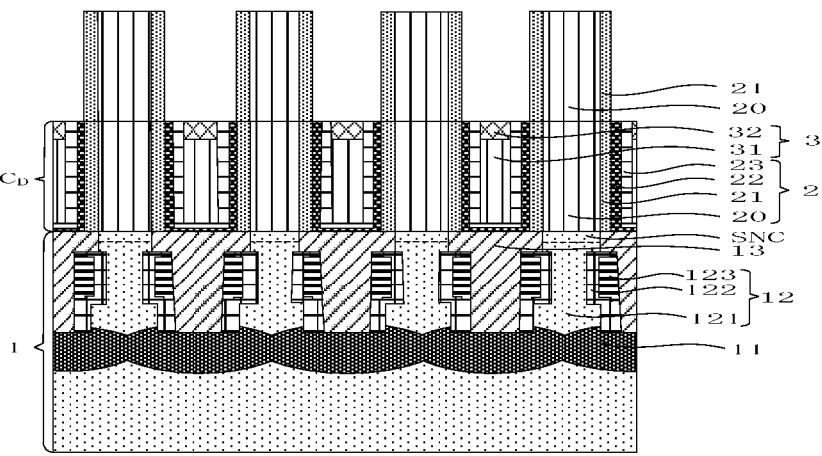

S220B: Form a first electrode 21 on a sidewall of the capacitive connection structure 20, as shown in FIG. 12.

S220C: Sequentially deposit a high-K dielectric material layer 220 and a second electrode material layer 230, as shown in FIG. 13.

Figure 13:
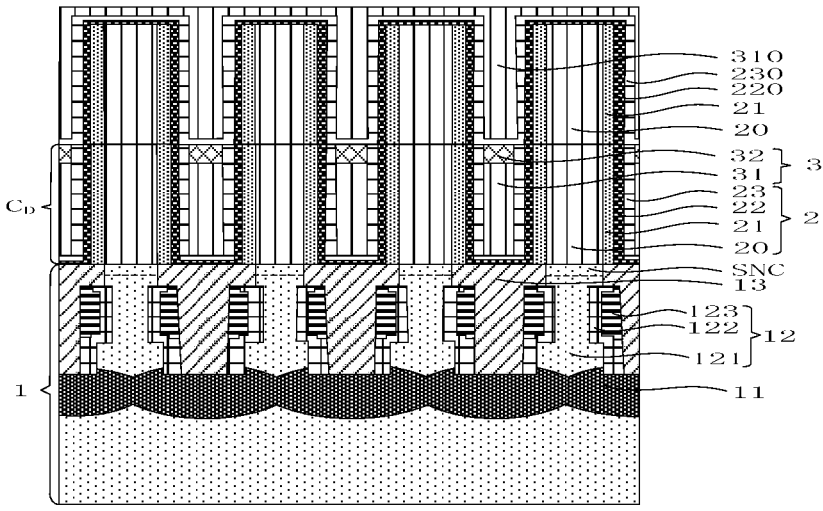

Optionally, in an example in which the semiconductor structure further includes the support structures 3, further referring to FIG. 13, S220C further includes: depositing an auxiliary conductive material layer 310 covering the second electrode material layer 230. Accordingly, referring to FIG. 14, the manufacturing method further includes: removing part of the auxiliary conductive material layer 310, to form auxiliary conductive portions 31 each located between any adjacent two of the capacitor units 2 in a direction parallel to the base 1.

Figure 14:
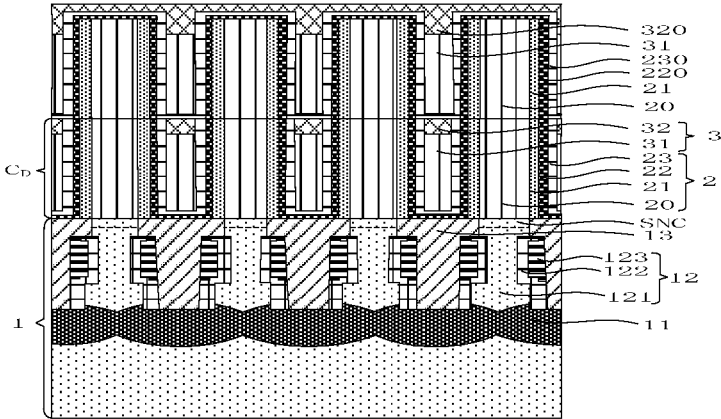

In some examples in which the support structure 3 further includes the support portion 32, referring to FIG. 14, the manufacturing method further includes: depositing a support material layer 320 covering the second electrode material layer 230 and the auxiliary conductive portions 31. Accordingly, referring to FIG. 15, the manufacturing method further includes: removing part of the support material layer 320, to form support portions 32 each located between any adjacent two of the capacitor units 2 in the direction parallel to the base 1. The support portion 32 is located above the auxiliary conductive portion 31, and forms a support structure 3 jointly with the auxiliary conductive portion 31.

Herein, it is understandable that the method of manufacturing the support structure 3 may be adjusted adaptively as the support structure 3 varies.

Figure 15:
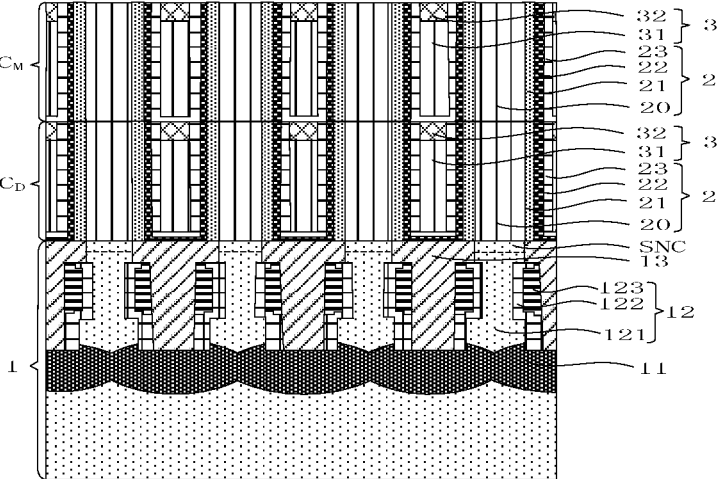

S220D: Remove part of the high-K dielectric material layer 220 and part of the second electrode material layer 230, to form a high-K dielectric layer 22 located on a sidewall of the first electrode 21 and a second electrode 23 located on a sidewall of the high-K dielectric layer 22, as shown in FIG. 15. Thus, preparation of the intermediate capacitor unit $C_M$ is completed.

In step S230, referring to FIG. 16 to FIG. 19, a top capacitor unit $C_T$ is stacked vertically above the intermediate capacitor unit $C_M$, which includes steps S230A to S230D.

Figure 16:
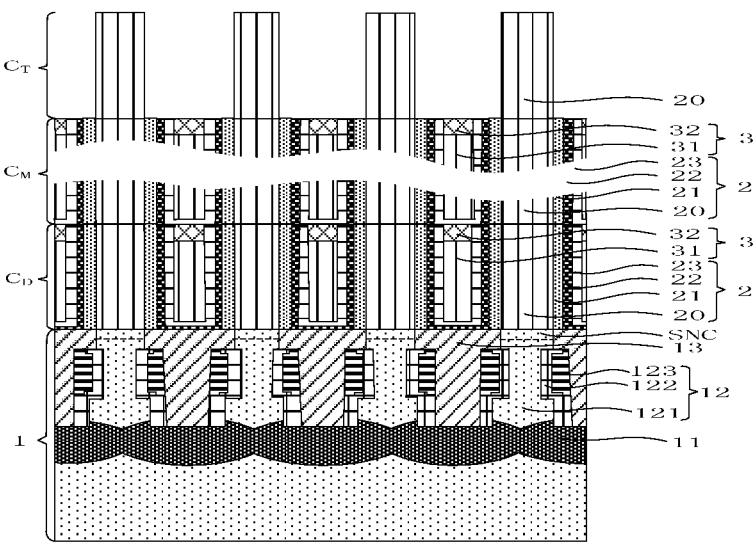

S230A: Form a capacitive connection structure 20 of the top capacitor unit $C_T$ vertically above the top-layer capacitive connection structure 20 in the intermediate capacitor unit $C_M$, as shown in FIG. 16.

For example, the capacitive connection structure 20 is formed through an epitaxial growth process. That is, an upper-layer capacitive connection structure 20 may be epitaxially grown on the surface of a lower-layer capacitive connection structure 20, such that the capacitive connection structure 20 in the top capacitor unit $C_T$ is self-aligned with the capacitive connection structure 20 in the intermediate capacitor unit $C_M$.

Figure 17:
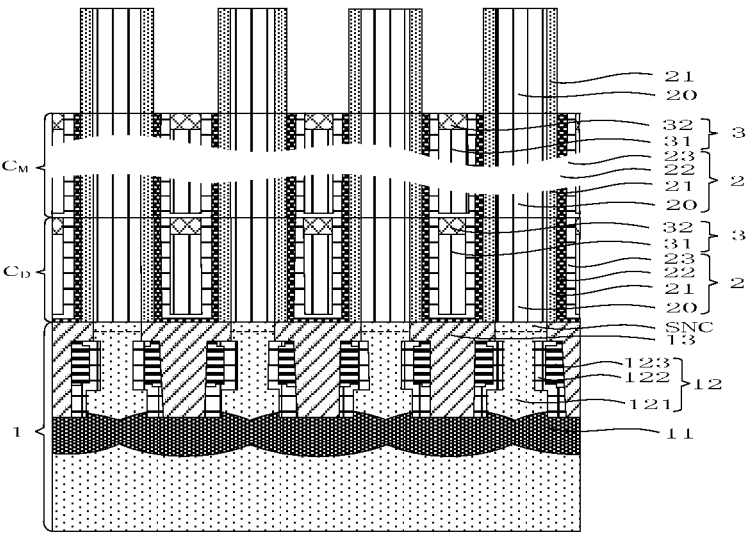

S230B: Form a first electrode 21 on a sidewall of the capacitive connection structure 20, as shown in FIG. 17.

S230C: Sequentially deposit a high-K dielectric material layer 220 and a second electrode material layer 230, as shown in FIG. 18.

Figure 18:
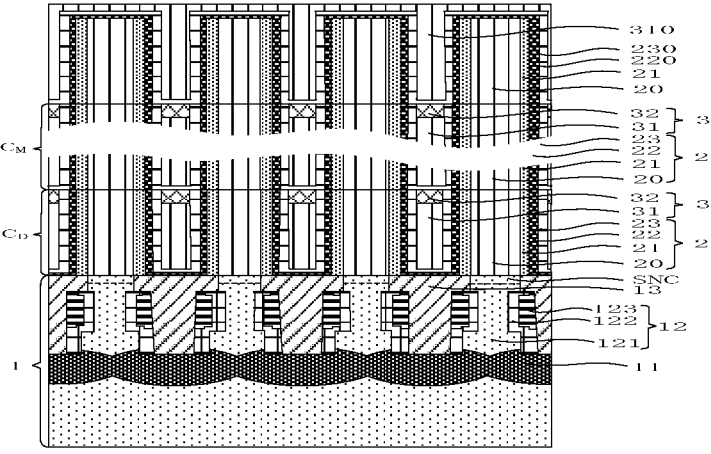

Optionally, in an example in which the semiconductor structure further includes the support structures 3, further referring to FIG. 18, S230C further includes: depositing an auxiliary conductive material layer 310 covering the second electrode material layer 230. Accordingly, referring to FIG. 19, the manufacturing method further includes: removing part of the auxiliary conductive material layer 310, to form auxiliary conductive portions 31 each located between any adjacent two of the capacitor units 2 in a direction parallel to the base 1. In this way, the support structure 3 may only consist of the auxiliary conductive portion 31.

Herein, it is understandable that the method of manufacturing the support structure 3 may be adjusted adaptively as the support structure 3 varies.

Figure 19:
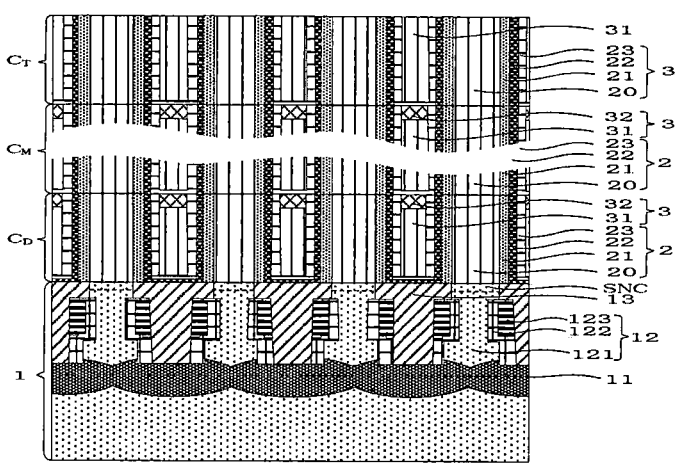

S230D: Remove part of the high-K dielectric material layer 220 and part of the second electrode material layer 230, to form a high-K dielectric layer 22 located on a sidewall of the first electrode 21 and a second electrode 23 located on a sidewall of the high-K dielectric layer 22, as shown in FIG. 19. Thus, preparation of the top capacitor unit $C_T$ is completed.

Figure 20:
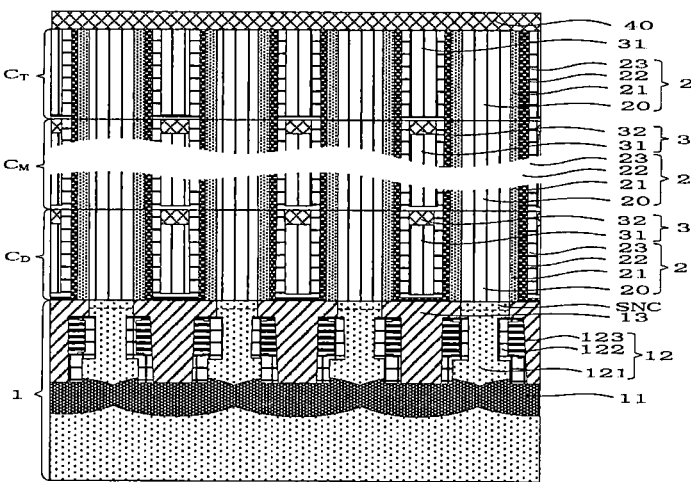

In step S300, referring to FIG. 20, a top dielectric material layer 40 covering the top capacitor unit $C_T$ is formed.

Figure 21:
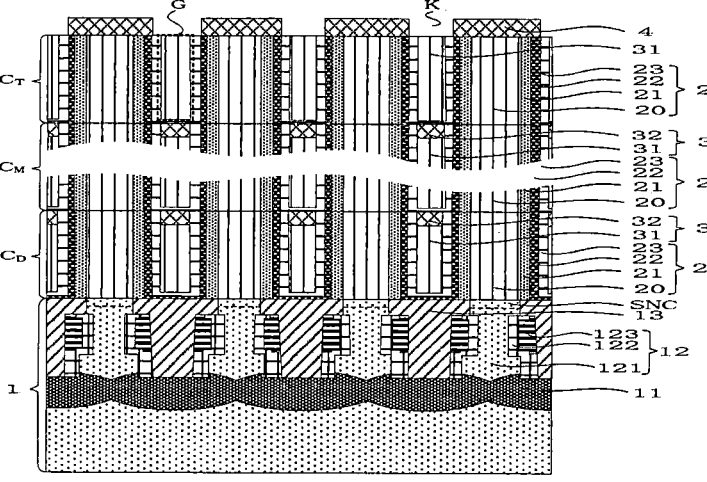

In step S400, referring to FIG. 21, the top dielectric material layer 40 is patterned to form a top dielectric layer 4. The top dielectric layer 4 has an opening K, and the second electrode 23 of the top capacitor unit $C_T$ is exposed from the opening K.

Optionally, further referring to FIG. 21, a groove G between adjacent second electrodes 23 in the top capacitor units $C_T$ is filled with the auxiliary conductive portion 31, and the auxiliary conductive portion 31 is also exposed from the opening K of the top dielectric layer 4.

In step S500, referring to FIG. 22, a common-source electrode layer 5 covering the top dielectric layer 4 is formed, where the common-source electrode layer 5 is connected to the second electrodes 23 in the top capacitor units $C_T$.

Optionally, further referring to FIG. 22, the common-source electrode layer 5 is further connected to the auxiliary conductive portions 31 exposed from the openings K of the top dielectric layer 4.

Referring to FIG. 23, in some embodiments, the manufacturing method is used for manufacturing the semiconductor structure shown in FIG. 2. Step S200 of stacking a plurality of capacitor units in a direction vertical to the capacitive contact structure to form a capacitor structure includes the following steps:

S210': Form a bottom capacitor unit vertically above the capacitive contact structure.

For example, a first electrode is formed vertically above the capacitive contact structure, and a high-K dielectric layer and a second electrode are sequentially formed on a sidewall of the first electrode.

S220': Stack one or more intermediate capacitor units layer by layer vertically above the bottom capacitor unit.

For example, there may be one or more layers of intermediate capacitor units. If the bottom capacitor unit is considered as a first-layer capacitor unit, the intermediate capacitor unit may be in an (N+1)-th layer, where N is a positive integer and $2 \le N+1 \le M$. Accordingly, forming the intermediate capacitor unit in an (N+1)-th layer includes: forming a first electrode of the (N+1)-th layer vertically above a first electrode of an N-th layer, and sequentially forming a high-K dielectric layer and a second electrode on a sidewall of the first electrode of the (N+1)-th layer. That is, the intermediate capacitor units may be stacked from the second layer to an M-th layer.

S230': Stack a top capacitor unit vertically above the intermediate capacitor unit.

For example, a first electrode of an (M+1)-th layer is formed vertically above a first electrode of an M-th layer, and a high-K dielectric layer and a second electrode are sequentially formed on a sidewall of the first electrode of the (M+1)-th layer.

Optionally, before the sequentially forming a high-K dielectric layer and a second electrode on a sidewall of the first electrode, the manufacturing method further includes: forming a barrier layer on the sidewall of the first electrode, and sequentially forming a high-K dielectric layer and a second electrode in a direction moving away from the first electrode.

In some embodiments, further referring to FIG. 23, the manufacturing method further includes the following steps:

S300': Form a common-source electrode layer covering a sidewall of the second electrode in the top capacitor unit and a top surface of the second electrode away from the base.

To illustrate the foregoing manufacturing method more clearly, the following embodiments are described with reference to FIG. 23 to FIG. 34.

In step S210', referring to FIG. 24 to FIG. 27, a bottom capacitor unit $C_D$ is formed vertically above the capacitive contact structure SNC, which includes steps S210'A to is S210'C.

S210'A: Form a first electrode 21 vertically above the capacitive contact structure SNC, as shown in FIG. 24.

For example, the first electrode 21 is formed through an epitaxial growth process. That is, the first electrode 21 may be epitaxially grown on the surface of the capacitive contact structure SNC, such that the first electrode 21 is stacked on the capacitive contact structure SNC in a self-aligned manner.

S210'B: Sequentially deposit a high-K dielectric material layer 220 and a second electrode material layer 230 on a sidewall of the first electrode 21, as shown in FIG. 25.

Figure 25:
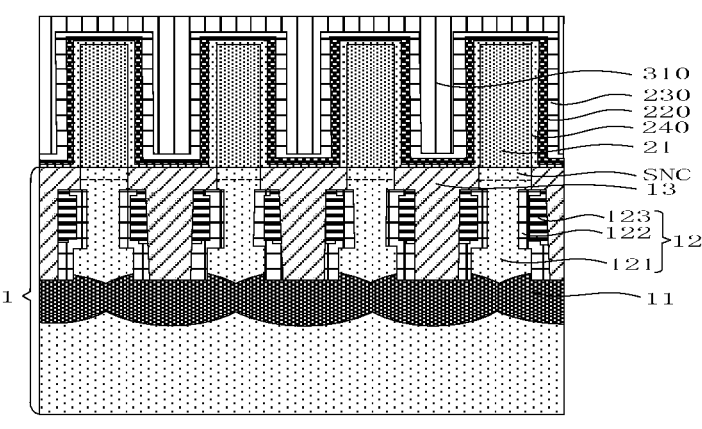

Optionally, in an example in which the semiconductor structure further includes the barrier layer 24, further referring to FIG. 25, before the sequentially depositing a high-K dielectric material layer 220 and a second electrode material layer 230 on a sidewall of the first electrode 21, the manufacturing method further includes: depositing a barrier material layer 240 on the sidewall of the first electrode 21, and then sequentially depositing a high-K dielectric material layer 220 and a second electrode material layer 230 on the barrier material layer 240 in a direction moving away from the first electrode 21.

Optionally, in an example in which the semiconductor structure further includes the support structures 3, further referring to FIG. 25, S210'B further includes: depositing an auxiliary conductive material layer 310 covering the second electrode material layer 230. Accordingly, referring to FIG. 26, the manufacturing method further includes: removing part of the auxiliary conductive material layer 310, to form auxiliary conductive portions 31 each located between any adjacent two of the capacitor units 2 in a direction parallel to the base 1.

Figure 26:
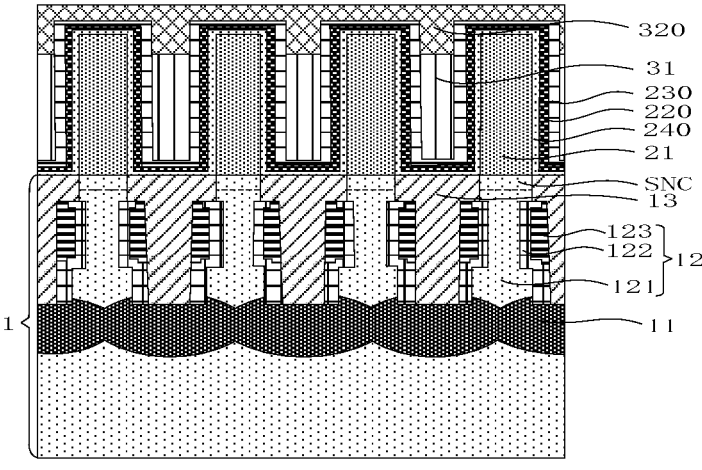

In some examples in which the support structure 3 further includes the support portion 32, further referring to FIG. 26, the manufacturing method further includes: depositing a support material layer 320 covering the second electrode material layer 230 and the auxiliary conductive portions 31. Accordingly, referring to FIG. 27, the manufacturing method further includes: removing part of the support material layer 320, to form support portions 32 each located between any adjacent two of the capacitor units 2 in the direction parallel to the base 1. The support portion 32 is located above the auxiliary conductive portion 31, and forms a support structure 3 jointly with the auxiliary conductive portion 31.

Herein, it is understandable that the method of manufacturing the support structure 3 may be adjusted adaptively as the support structure 3 varies.

S210'C: Remove part of the high-K dielectric material layer 220 and part of the second electrode material layer 230, to form a high-K dielectric layer 22 located on a sidewall of the first electrode 21 and a second electrode 23 located on a sidewall of the high-K dielectric layer 22, as shown in FIG. 27.

Figure 27:
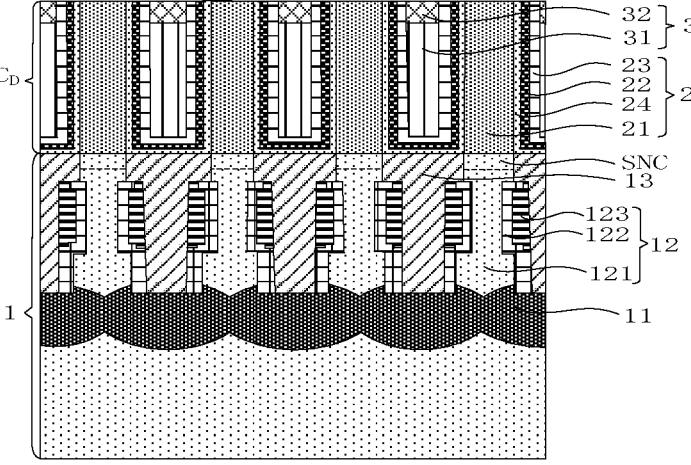

Optionally, further referring to FIG. 27, in an example in which the barrier material layer 240 is deposited, part of the barrier material layer 240 is removed to a barrier layer 24 located on the sidewall of the first electrode 21.

Thus, preparation of the bottom capacitor unit $C_D$ is completed.

In step S220', referring to FIG. 28 to FIG. 31, one or more intermediate capacitor units $C_M$ are stacked layer by layer vertically above the bottom capacitor unit $C_D$, which includes steps S220'A to S220'C.

Figure 28:
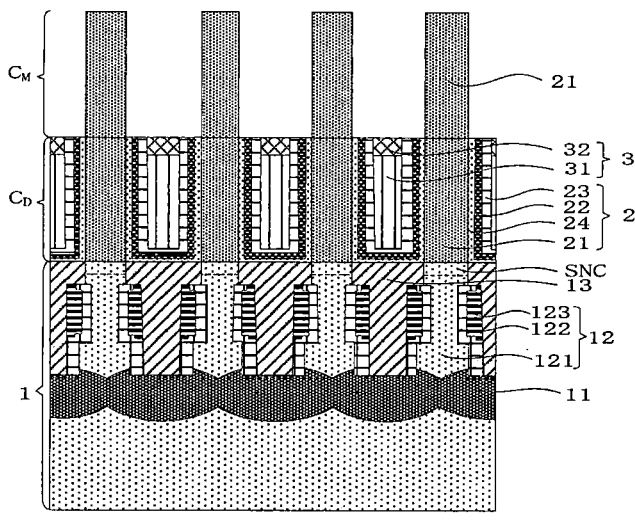

S220'A: Form a first-layer first electrode 21 of the intermediate capacitor unit $C_M$ vertically above the first electrode 21 in the bottom capacitor unit $C_D$, as shown in FIG. 28.

For example, the first electrode 21 is formed through an epitaxial growth process. That is, an upper-layer first electrode 21 may be epitaxially grown on the surface of a lower-layer first electrode 21, to achieve self-alignment between the first electrodes 21 in the two layers.

It is understandable that, after the first electrode 21 is formed, in the intermediate capacitor units $C_M$ at any layers, identical structures are manufactured by a same method. Therefore, manufacturing of other structures in the intermediate capacitor unit $C_M$ in one layer is used as an example for description.

S220'B: Sequentially deposit a high-K dielectric material layer 220 and a second electrode material layer 230 on a sidewall of the first electrode 21, as shown in FIG. 29.

Figure 29:
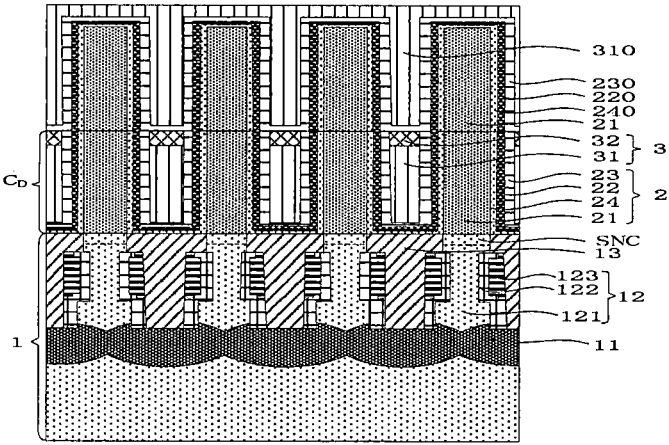

Optionally, in an example in which the semiconductor structure further includes the barrier layer 24, further referring to FIG. 29, before the sequentially depositing a high-K dielectric material layer 220 and a second electrode material layer 230 on a sidewall of the first electrode 21, the manufacturing method further includes: depositing a barrier material layer 240 on the sidewall of the first electrode 21, and then sequentially depositing a high-K dielectric material layer 220 and a second electrode material layer 230 on the barrier material layer 240 in a direction moving away from the first electrode 21.

Optionally, in an example in which the semiconductor structure further includes the support structures 3, further referring to FIG. 29, S220'B further includes: depositing an auxiliary conductive material layer 310 covering the second electrode material layer 230. Accordingly, referring to FIG. 30, the manufacturing method further includes: removing part of the auxiliary conductive material layer 310, to form auxiliary conductive portions 31 each located between any adjacent two of the capacitor units 2 in a direction parallel to the base 1.

Figure 30:
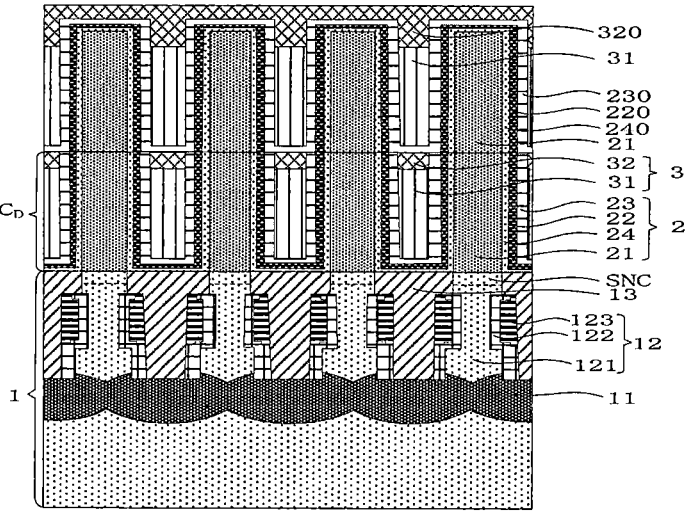

In some examples in which the support structure 3 further includes the support portion 32, further referring to FIG. 30, the manufacturing method further includes: depositing a support material layer 320 covering the second electrode material layer 230 and the auxiliary conductive portions 31. Accordingly, referring to FIG. 31, the manufacturing method further includes: removing part of the support material layer 320, to form support portions 32 each located between any adjacent two of the capacitor units 2 in the direction parallel to the base 1. The support portion 32 is located above the auxiliary conductive portion 31, and forms a support structure 3 jointly with the auxiliary conductive portion 31.

Herein, it is understandable that the method of manufacturing the support structure 3 may be adjusted adaptively as the support structure 3 varies.

S220'C: Remove part of the high-K dielectric material layer 220 and part of the second electrode material layer 230, to form a high-K dielectric layer 22 located on a sidewall of the first electrode 21 and a second electrode 23 located on a sidewall of the high-K dielectric layer 22, as shown in FIG. 31.

Figure 31:
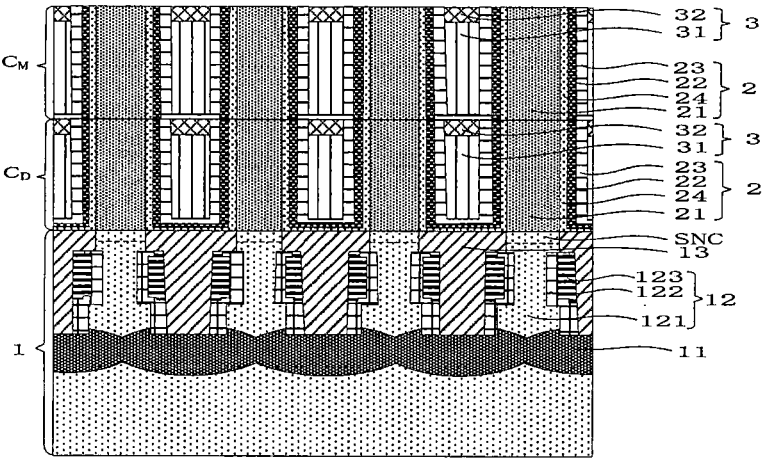

Optionally, further referring to FIG. 31, in an example in which the barrier material layer 240 is deposited, part of the barrier material layer 240 is removed to a barrier layer 24 located on the sidewall of the first electrode 21.

Thus, preparation of the intermediate capacitor unit $C_M$ is completed.

Figure 32:
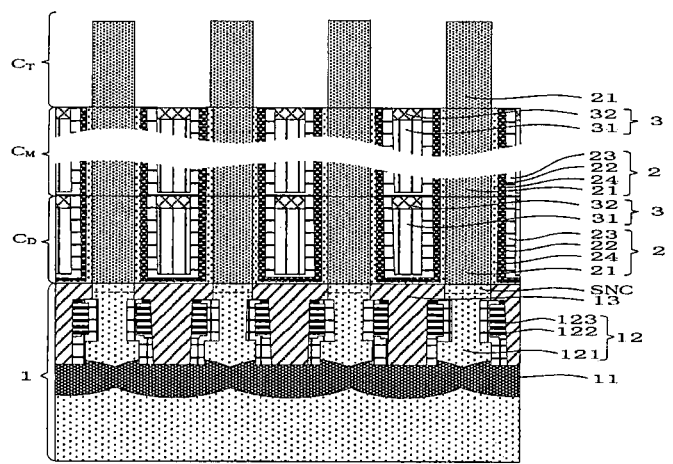
Figure 33:
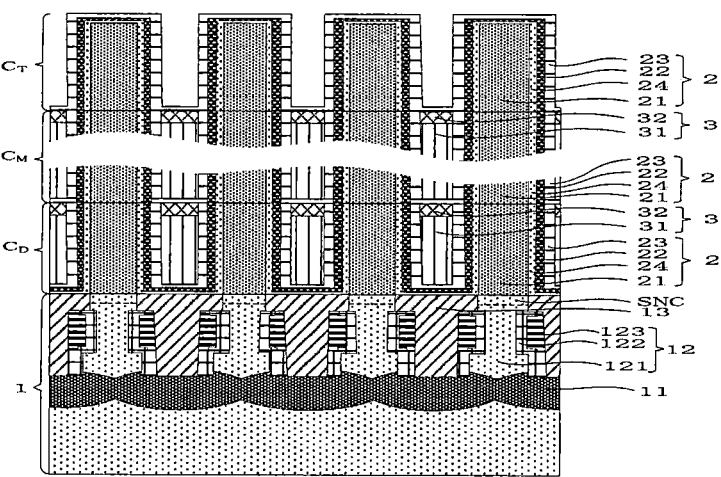

In step S230, referring to FIG. 32 and FIG. 33, a top capacitor unit $C_T$ is stacked vertically above the intermediate capacitor unit $C_M$, which includes steps S230'A to S230'B.

S230'A: Form a first electrode 21 of the top capacitor unit $C_T$ vertically above the top-layer first electrode 21 in the intermediate capacitor unit $C_M$, as shown in FIG. 32.

For example, the first electrode 21 is formed through an epitaxial growth process. That is, an upper-layer first electrode 21 may be epitaxially grown on the surface of a lower-layer first electrode 21, such that the first electrode 21 of the top capacitor unit $C_T$ is stacked on the first electrode 21 of the intermediate capacitor unit $C_M$ in a self-aligned manner.

S230'B: Sequentially deposit a high-K dielectric layer 22 and a second electrode layer 23 on a structure obtained after the first electrode 21 is formed, as shown in FIG. 33. The high-K dielectric layer 22 is at least located on the sidewall of the first electrode 21 and a top surface of the first electrode 21 away from the base 1. The second electrode 23 covers a sidewall of the high-K dielectric layer and a top surface of the high-K dielectric layer away from the base.

Optionally, in an example in which the semiconductor structure further includes the barrier layer 24, further referring to FIG. 33, before the sequentially depositing a high-K dielectric layer 22 and a second electrode layer 23 on a structure obtained after the first electrode 21 is formed, the manufacturing method further includes: depositing a barrier layer 24 on the structure obtained after the first electrode 21 is formed, and then sequentially depositing a high-K dielectric layer 22 and a second electrode layer 23 on the barrier layer 24 in a direction moving away from the first electrode 21.

Thus, preparation of the top capacitor unit $C_T$ is completed.

Figure 34:
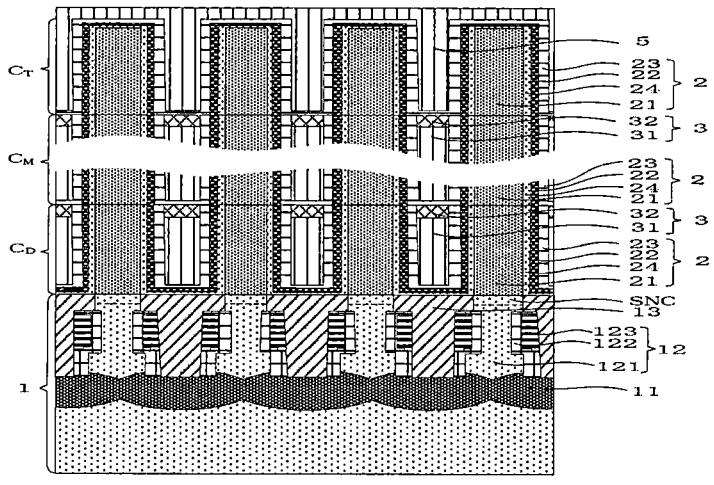

Step S300': Form a common-source electrode layer 5 covering a sidewall of the second electrode 23 in the top capacitor unit $C_T$ and a top surface of the second electrode 23 away from the base 1, as shown in FIG. 34.

The common-source electrode layer 5 covers the second electrodes 23, such that the second electrodes 23 in a plurality of capacitor units 2 in a direction parallel to the base 1 are interconnected and an electrical signal is provided to each second electrode 23. The common-source electrode layer 5 may be made of a metal or metal compound with good conductivity through deposition, for example, made of silicon germanium (SiGe) through deposition. Moreover, the common-source electrode layer 5 covers the second electrodes 23, and can fill up the groove G between adjacent second electrodes 23 in the top capacitor units $C_T$. That is, the support structure 3 in the groove G between adjacent second electrodes 23 in the top capacitor units $C_T$ may be omitted, such that a part filled with the common-source electrode layer 5 is used to achieve a supporting function.

The semiconductor manufacturing method provided in the embodiments of the present disclosure is used for manufacturing the semiconductor structure in the foregoing embodiments. The manufacturing method has all the technical advantages of the semiconductor structure described above. Details are not described herein again.

In addition, the deposition process mentioned in the embodiments of the present disclosure includes, but is not limited to, physical vapor deposition (PVD), chemical vapor deposition (CVD), or atomic layer deposition (ALD).

It should be understood that the execution order of some steps in the embodiments of the present disclosure is not strictly limited, and these steps may be executed simultaneously or in other orders. Moreover, in the embodiments of the present disclosure, at least some of the steps of the manufacturing method may include a plurality of sub-steps or stages. The sub-steps or stages are not necessarily executed at the same time, but may be executed at different times. The execution order of the sub-steps or stages is not necessarily carried out sequentially, but may be executed alternately with other steps or at least some of the sub-steps or stages of other steps.

The technical characteristics of the foregoing embodiments can be employed in arbitrary combinations. To provide a concise description of these examples, all possible combinations of all technical characteristics of the embodiment may not be described; however, these combinations of technical characteristics should be construed as disclosed in the description as long as no contradiction occurs.

The above embodiments are only intended to illustrate several implementations of the present disclosure in detail, and they should not be construed as a limitation to the patentable scope of the present disclosure. It should be noted that those of ordinary skill in the art can further make variations and improvements without departing from the conception of the present disclosure. These variations and improvements all fall within the protection scope of the present disclosure. Therefore, the protection scope of the present disclosure should be subject to the protection scope defined by the claims.

The invention claimed is:

1. A semiconductor structure, comprising:
a base, wherein the base is provided with at least two capacitive contact structures;
at least two capacitor structures, wherein each capacitor structure is connected to each capacitive contact structure, the capacitor structure comprises a plurality of capacitor units stacked in a direction vertical to the capacitive contact structure; and
a support structure, located between adjacent capacitor structures, wherein the support structure comprises: an auxiliary conductive portion and a support portion alternately arranged in a vertical direction perpendicular to the base, the support portion is located between adjacent capacitor units in the direction parallel to the base.

2. The semiconductor structure according to claim 1, wherein the capacitor unit comprises: a capacitive connection structure, a first electrode, a second electrode, and a high-K dielectric layer;
the capacitive connection structure is located vertically above the capacitive contact structure, and in any adjacent two of the capacitor units in the direction vertical to the capacitive contact structure, the capacitive connection structures are interconnected and connected to the capacitive contact structure;
the first electrode is located on a sidewall of the capacitive connection structure, and in any adjacent two of the capacitor units in the direction vertical to the capacitive contact structure, the first electrodes are interconnected;
the high-K dielectric layer is arranged on a sidewall of the first electrode, and in any adjacent two of the capacitor units in the direction vertical to the capacitive contact structure, the high-K dielectric layers are interconnected; and the second electrode is arranged on a sidewall of the high-K dielectric layer, and in any adjacent two of the capacitor units in the direction vertical to the capacitive contact structure, the second electrodes are interconnected.

3. The semiconductor structure according to claim 2, further comprising: a top dielectric layer covering the capacitor structure, and a common-source electrode layer located above the top dielectric layer, wherein the top dielectric layer has an opening, and the common-source electrode layer is connected to the second electrode through the opening.

4. The semiconductor structure according to claim 2, wherein a plurality of capacitive contact structures are distributed in an array on the base, and in any adjacent two of the capacitor units in a direction parallel to the base, the second electrodes are interconnected;

wherein in any adjacent two of the capacitor units in the direction parallel to the base, bottom portions of the second electrodes are interconnected and form a groove; and the support structure is located in the groove.

5. The semiconductor structure according to claim 4, wherein an upper surface of the support structure away from the base is flush with a top surface of the second electrode away from the base;

wherein the auxiliary conductive portion is connected to the adjacent second electrode.

6. The semiconductor structure according to claim 1, wherein the capacitor unit comprises: a first electrode, a second electrode, and a high-K dielectric layer;

the first electrode is located vertically above the capacitive contact structure, and in any adjacent two of the capacitor units in the direction vertical to the capacitive contact structure, the first electrodes are interconnected and connected to the capacitive contact structure;

the high-K dielectric layer is arranged on a sidewall of the first electrode, and in any adjacent two of the capacitor units in the direction vertical to the capacitive contact structure, the high-K dielectric layers are interconnected; and the second electrode is arranged on a sidewall of the high-K dielectric layer, and in any adjacent two of the capacitor units in the direction vertical to the capacitive contact structure, the second electrodes are interconnected;

wherein a barrier layer is provided between the high-K dielectric layer and the first electrode.

7. The semiconductor structure according to claim 6, wherein the high-K dielectric layer in the capacitor unit in a top layer further covers a top surface of the first electrode away from the base, and the second electrode of the capacitor unit in the top layer further covers a top surface of the high-K dielectric layer away from the base; and the semiconductor structure further comprises: a common-source electrode layer covering a sidewall of the second electrode and a top surface of the second electrode away from the base.

8. The semiconductor structure according to claim 6, wherein a plurality of capacitive contact structures are distributed in an array on the base, and in any adjacent two of the capacitor units in a direction parallel to the base, the second electrodes are interconnected.

9. A method of manufacturing a semiconductor structure, comprising:

providing a base, wherein the base is provided with at least two capacitive contact structures; and forming at least two capacitor structures and a support structure, wherein each capacitor structure is connected to each capacitive contact structure, the capacitor structure comprises a plurality of capacitor units stacked in a direction vertical to the capacitive contact structure, the support structure is located between adjacent capacitor structures, and the support structure comprises: an auxiliary conductive portion and a support portion alternately arranged in a vertical direction perpendicular to the base, the support portion is located between adjacent capacitor units in the direction parallel to the base.

10. The method of manufacturing the semiconductor structure according to claim 9, wherein the stacking a plurality of capacitor units in a direction vertical to the capacitive contact structure to form a capacitor structure comprises:

forming a bottom capacitor unit vertically above the capacitive contact structure, comprising: forming a capacitive connection structure vertically above the capacitive contact structure, and sequentially forming a first electrode, a high-K dielectric layer, and a second electrode on a sidewall of the capacitive connection structure;

stacking an intermediate capacitor unit layer by layer vertically above the bottom capacitor unit, wherein forming the intermediate capacitor unit in an (N+1)-th layer comprises: forming a capacitive connection structure of the (N+1)-th layer vertically above a capacitive connection structure of an N-th layer, and sequentially forming a first electrode, a high-K dielectric layer, and a second electrode on a sidewall of the capacitive connection structure of the (N+1)-th layer, wherein N is a positive integer, and $2 \leq N+1 \leq M$; and stacking a top capacitor unit vertically above the intermediate capacitor unit, comprising: forming a capacitive connection structure of an (M+1)-th layer vertically above a capacitive connection structure of an M-th layer, and sequentially forming a first electrode, a high-K dielectric layer, and a second electrode on a sidewall of the capacitive connection structure of the (M+1)-th layer;

wherein the capacitive connection structure is formed through an epitaxial growth process.

11. The method of manufacturing the semiconductor structure according to claim 10, further comprising:

forming a top dielectric material layer covering the top capacitor unit;

patterning the top dielectric material layer to form a top dielectric layer, wherein the top dielectric layer has an opening, and the second electrode of the top capacitor unit is exposed from the opening; and forming a common-source electrode layer covering the top dielectric layer, wherein the common-source electrode layer is connected to the second electrode.

12. The method of manufacturing the semiconductor structure according to claim 10, wherein the sequentially forming a first electrode, a high-K dielectric layer, and a second electrode on a sidewall of the capacitive connection structure comprises:

forming the first electrode on the sidewall of the capacitive connection structure;

sequentially depositing a high-K dielectric material layer and a second electrode material layer; and removing part of the high-K dielectric material layer and part of the second electrode material layer, to form the high-K dielectric layer located on a sidewall of the first electrode and the second electrode located on a sidewall of the high-K dielectric layer.

13. The method of manufacturing the semiconductor structure according to claim 12, wherein before the removing part of the high-K dielectric material layer and part of the second electrode material layer, to form a high-K dielectric layer located on a sidewall of the first electrode and a second electrode located on a sidewall of the high-K dielectric layer, the manufacturing method further comprises:

depositing an auxiliary conductive material layer covering the second electrode material layer; and removing part of the auxiliary conductive material layer, to form the auxiliary conductive portion located between any adjacent two of the capacitor units in a direction parallel to the base.

14. The method of manufacturing the semiconductor structure according to claim 13, wherein before the removing part of the high-K dielectric material layer and part of the second electrode material layer, to form a high-K dielectric layer located on a sidewall of the first electrode and a second electrode located on a sidewall of the high-K dielectric layer, the manufacturing method further comprises:

depositing a support material layer covering the second electrode material layer and the auxiliary conductive portion; and removing part of the support material layer, to form the support portion located between any adjacent two of the capacitor units in the direction parallel to the base, wherein the support portion is located above the auxiliary conductive portion, and forms the support structure jointly with the auxiliary conductive portion.

15. The method of manufacturing the semiconductor structure according to claim 9, wherein the stacking a plurality of capacitor units in a direction vertical to the capacitive contact structure to form a capacitor structure comprises:

forming a bottom capacitor unit vertically above the capacitive contact structure, comprising: forming a first electrode vertically above the capacitive contact structure, and sequentially forming a high-K dielectric layer and a second electrode on a sidewall of the first electrode;

stacking an intermediate capacitor unit layer by layer vertically above the bottom capacitor unit, wherein forming the intermediate capacitor unit in an (N+1)-th layer comprises: forming a first electrode of the (N+1)-th layer vertically above a first electrode of an N-th layer, and sequentially forming a high-K dielectric layer and a second electrode on a sidewall of the first electrode of the (N+1)-th layer, wherein N is a positive integer and $2 \leq N+1 \leq M$; and stacking a top capacitor unit vertically above the intermediate capacitor unit, comprising: forming a first electrode of an (M+1)-th layer vertically above a first electrode of an M-th layer, and sequentially forming a high-K dielectric layer and a second electrode at least on a sidewall of the first electrode of the (M+1)-th layer;

wherein the first electrode is formed through an epitaxial growth process.

16. The method of manufacturing the semiconductor structure according to claim 15, wherein in the step of stacking an intermediate capacitor unit layer by layer vertically above the bottom capacitor unit, the sequentially forming a high-K dielectric layer and a second electrode on a sidewall of the first electrode comprises: sequentially depositing a high-K dielectric material layer and a second electrode material layer on a structure obtained after the first electrode is formed; removing part of the high-K dielectric material layer and part of the second electrode material layer, to form a high-K dielectric layer located on the sidewall of the first electrode and a second electrode located on a sidewall of the high-K dielectric layer; and in the step of stacking a top capacitor unit vertically above the intermediate capacitor unit, the sequentially forming a high-K dielectric layer and a second electrode at least on a sidewall of the first electrode comprises: sequentially depositing a high-K dielectric layer and a second electrode on a structure obtained after the first electrode is formed, wherein the high-K dielectric layer at least covers the sidewall of the first electrode and a top surface of the first electrode away from the base, and the second electrode covers a sidewall of the high-K dielectric layer and a top surface of the high-K dielectric layer away from the base.

17. The method of manufacturing the semiconductor structure according to claim 16, wherein before the removing part of the high-K dielectric material layer and part of the second electrode material layer, to form a high-K dielectric layer located on a sidewall of the first electrode and a second electrode located on a sidewall of the high-K dielectric layer, the manufacturing method further comprises:

depositing an auxiliary conductive material layer covering the second electrode material layer; and removing part of the auxiliary conductive material layer, to form the auxiliary conductive portion located between any adjacent two of the capacitor units in a direction parallel to the base.

18. The method of manufacturing the semiconductor structure according to claim 17, wherein before the removing part of the high-K dielectric material layer and part of the second electrode material layer, to form a high-K dielectric layer located on a sidewall of the first electrode and a second electrode located on a sidewall of the high-K dielectric layer, the manufacturing method further comprises:

depositing a support material layer covering the second electrode material layer and the auxiliary conductive portion; and removing part of the support material layer, to form the support portion located between any adjacent two of the capacitor units in the direction parallel to the base, wherein the support portion is located above the auxiliary conductive portion, and forms the support structure jointly with the auxiliary conductive portion.

19. The method of manufacturing the semiconductor structure according to claim 16, wherein after the stacking a top capacitor unit vertically above the intermediate capacitor unit, the manufacturing method further comprises: forming a common-source electrode layer covering a sidewall of the second electrode in the top capacitor unit and a top surface of the second electrode away from the base.

20. The method of manufacturing the semiconductor structure according to claim 15, wherein before the forming a high-K dielectric layer, the manufacturing method further comprises: forming a barrier layer covering the first electrode; and the forming a high-K dielectric layer further comprises: forming the high-K dielectric layer on a surface of the barrier layer away from the first electrode.

* * * * *